United States Patent
Matsukizono

(10) Patent No.: US 10,656,483 B2
(45) Date of Patent: May 19, 2020

(54) SEMICONDUCTOR APPARATUS AND METHOD FOR MANUFACTURING SEMICONDUCTOR APPARATUS

(71) Applicant: Sharp Kabushiki Kaisha, Sakai, Osaka (JP)

(72) Inventor: Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 43 days.

(21) Appl. No.: 16/084,260

(22) PCT Filed: Mar. 3, 2017

(86) PCT No.: PCT/JP2017/008589
§ 371 (c)(1),
(2) Date: Jan. 29, 2019

(87) PCT Pub. No.: WO2017/159413
PCT Pub. Date: Sep. 21, 2017

(65) Prior Publication Data
US 2019/0155119 A1  May 23, 2019

(30) Foreign Application Priority Data
Mar. 14, 2016 (JP) .................................. 2016-049692

(51) Int. Cl.
*G02F 1/1362* (2006.01)
*H01L 29/66* (2006.01)
(Continued)

(52) U.S. Cl.
CPC ...... *G02F 1/136209* (2013.01); *G02F 1/1368* (2013.01); *G02F 1/136286* (2013.01);
(Continued)

(58) Field of Classification Search
CPC ......... G02F 1/136209; G02F 1/136286; G02F 1/1368; G02F 1/134363;
(Continued)

(56) References Cited

U.S. PATENT DOCUMENTS 6,025,218 A * 2/2000 Brotherton ........ H01L 29/66757
438/166
2010/0295042 A1 11/2010 Yano et al.
(Continued)

FOREIGN PATENT DOCUMENTS

JP    02-177443 A   7/1990
JP    2012-134475 A   7/2012
(Continued)

*Primary Examiner* — Tu-Tu V Ho
(74) *Attorney, Agent, or Firm* — Keating & Bennett, LLP

(57) ABSTRACT

A semiconductor apparatus (100) is provided with: a substrate (1); and a thin-film transistor (10). The thin-film transistor has: an oxide semiconductor layer (11) that includes a channel region (11a) and first and second contact regions (11b, 11c); a gate insulating layer (12) that is provided so as to cover the oxide semiconductor layer; a gate electrode (13) that is provided on the gate insulating layer and that overlaps the channel region via the gate insulating layer; a source electrode (14) that is electrically connected to the first contact region; and a drain electrode (15) that is electrically connected to the second contact region. This semiconductor apparatus is further provided with a light-shielding layer (2) arranged between the oxide semiconductor layer and the substrate, and the channel region is aligned to the part of the light-shielding layer overlapping the oxide semiconductor layer.

23 Claims, 14 Drawing Sheets

(51) Int. Cl.
*G02F 1/1368* (2006.01)
*G09F 9/00* (2006.01)
*G09F 9/30* (2006.01)
*H01L 29/423* (2006.01)
*H01L 29/49* (2006.01)
*H01L 27/12* (2006.01)
*H01L 29/786* (2006.01)
*G02F 1/1343* (2006.01)

(52) U.S. Cl.
CPC .............. *G09F 9/00* (2013.01); *G09F 9/30* (2013.01); *H01L 27/1225* (2013.01); *H01L 29/42384* (2013.01); *H01L 29/4908* (2013.01); *H01L 29/66969* (2013.01); *H01L 29/7869* (2013.01); *H01L 29/78633* (2013.01); *H01L 29/78696* (2013.01); *G02F 1/134363* (2013.01); *G02F 2001/13685* (2013.01); *G02F 2201/40* (2013.01)

(58) Field of Classification Search
CPC ....... G02F 2001/13685; G02F 2201/40; G09F 9/00; G09F 9/30; H01L 27/1225; H01L 29/42384; H01L 29/4908; H01L 29/66969; H01L 29/78633; H01L 29/7869; H01L 29/78696

USPC .......................................................... 257/43
See application file for complete search history.

(56) References Cited

U.S. PATENT DOCUMENTS

| 2012/0138922 | A1  | 6/2012  | Yamazaki et al. |           |
|--------------|-----|---------|-----------------|-----------|
| 2013/0320334 | A1  | 12/2013 | Yamazaki et al. |           |
| 2014/0001468 | A1  | 1/2014  | Yamazaki et al. |           |
| 2014/0286076 | A1  | 9/2014  | Aoki et al.     |           |
| 2015/0325600 | A1* | 11/2015 | Sakata          | H01L 27/1218 |
|              |     |         |                 | 257/43    |
| 2016/0291434 | A1* | 10/2016 | Sugimoto        | H01L 29/786 |
| 2016/0293771 | A1* | 10/2016 | Long            | H01L 27/12 |
| 2017/0092711 | A1* | 3/2017  | Tsai            | H01L 27/3276 |

FOREIGN PATENT DOCUMENTS

| JP | 2014-007399 A  | 1/2014  |
| JP | 2014-030000 A  | 2/2014  |
| JP | 2014-209727 A  | 11/2014 |
| WO | 2009/093625 A1 | 7/2009  |

\* cited by examiner

SEMICONDUCTOR APPARATUS AND METHOD FOR MANUFACTURING SEMICONDUCTOR APPARATUS

TECHNICAL FIELD

The present invention relates to a semiconductor device, and specifically to a semiconductor device including an oxide semiconductor TFT. The present invention also relates to a method for producing such a semiconductor device.

BACKGROUND ART

Today, a display apparatus including an active matrix substrate that includes a switching element in each of pixels (e.g., liquid crystal display apparatus) is in wide use. An active matrix substrate including a thin film transistor (hereinafter, referred to as a "TFT") as a switching element is referred to as a "TFT substrate". In this specification, a portion of the TFT substrate that corresponds to a pixel of the display apparatus may also be referred to as a "pixel".

Recently, it has been proposed to use an oxide semiconductor, instead of amorphous silicon or polycrystalline silicon, as a material of an active layer of the TFT. Such a TFT is referred to as an "oxide semiconductor TFT". The oxide semiconductor has a higher mobility than that of amorphous silicon. Therefore, the oxide semiconductor TFT is operable at a higher speed than an amorphous silicon TFT. An oxide semiconductor film is formed by a simpler process than a polycrystalline silicon film, and therefore, is applicable to a device requiring a large area size.

The oxide semiconductor TFT may be produced by a process substantially the same as that of the amorphous silicon TFT. Therefore, many oxide semiconductor TFTs produced today have a bottom-gate structure, like the amorphous silicon TFT.

Needless to say, a top-gate structure is not unadoptable for an oxide semiconductor TFT. Use of the top-gate structure easily decreases a parasitic capacitance caused by overlapping of a gate electrode and a source electrode/a drain electrode, and therefore, is advantageous to design a circuit operating at a high speed.

A semiconductor device including an oxide semiconductor TFT of a top-gate structure is disclosed in, for example, Patent Document No. 1. FIG. 16 shows a semiconductor device 800 disclosed in Patent Document No. 1.

As shown in FIG. 16, the semiconductor device 800 includes a substrate 801 and an oxide semiconductor TFT 810 supported by the substrate 801. The oxide semiconductor TFT 810 includes an oxide semiconductor layer 811, a gate insulating layer 812, a gate electrode 813, a source electrode 814 and a drain electrode 815.

On the substrate 801, underlying insulating layers 803*a* and 803*b* are formed in this order. On the upper underlying insulating layer 803*b*, the oxide semiconductor layer 811 is formed. The oxide semiconductor layer 811 includes a channel region 811*a* and low resistance regions 811*b* and 811*c* respectively located to two sides of the channel region 811*a*. On the channel region 811*a* of the oxide semiconductor layer 811, the gate insulating layer 812 and the gate electrode 813 are formed in this order.

A silicon nitride film 816 is formed so as to cover the oxide semiconductor layer 811, the gate insulating layer 812 and the gate electrode 813. On the silicon nitride film 816, an interlayer insulating layer 806 is formed. In the silicon nitride film 816 and the interlayer insulating layer 806, contact holes respectively exposing a part of the low resistance region 811*b* and a part of the low resistance region 811*c* of the oxide semiconductor layer 811 are formed. The source electrode 814 and the drain electrode 815 are respectively connected with the low resistance regions 811*b* and 811*c* in the contact holes.

During the production of the semiconductor device 800, an oxide insulating film (e.g., silicon oxide film) that is to be the gate insulating film 812 is deposited so as to cover the oxide semiconductor layer 811, and then the gate electrode 813 is formed. Then, the oxide insulating film is etched using the gate electrode 813 as a mask, so that the gate insulating layer 812 is formed. The etching results in exposing portions of the oxide semiconductor layer 811 that are not covered with the gate electrode 813. Next, the silicon nitride film 816 is formed. Therefore, the portions of the oxide semiconductor layer 811 that are in contact with the silicon nitride film 816 are supplied with nitrogen and thus are decreased in resistance, and as a result, become the low resistance regions 811*b* and 811*c*. The remaining portion becomes the channel region 811*a*.

It is described regarding the semiconductor device 800 in Patent Document No. 1 that since the low resistance regions 811*b* and 811*c* are formed in this manner, the oxide semiconductor TFT 810 is obtained by a relatively simple process to have a high on-characteristic.

CITATION LIST

Patent Literature

Patent Document No. 1: Japanese Laid-Open Patent Publication No. 2014-30000

SUMMARY OF INVENTION

Technical Problem

In a general transmissive liquid crystal display apparatus, a TFT substrate is located on a backlight unit side (rear side) whereas a color filter substrate facing the TFT substrate is located on a viewer side (front side). Therefore, in the case where the oxide semiconductor TFT has a top-gate structure as in Patent Document No. 1, light that is output from the backlight unit and incident on the TFT substrate from the rear side is directly directed toward the oxide semiconductor layer, which is an active layer of the TFT. The oxide semiconductor has a characteristic of being deteriorated by being irradiated with light (hereinafter, referred to as "photodegradation"). Therefore, the luminance of the backlight unit needs to be suppressed low in order to guarantee the reliability of the TFT. For this reason, such a liquid crystal display apparatus having an oxide semiconductor TFT of a top-gate structure has an inferior visual recognizability when being used outdoors.

In the step of depositing the silicon nitride film 816 for the semiconductor device 800 in Patent Document No. 1, mixed gas of silane and nitrogen, silane, or mixed gas of nitrogen and ammonia is used as material gas. Silane and ammonia are decomposed in plasma to generate a hydrogen radical. The hydrogen radical acts to reduce the oxide semiconductor to increase the carrier concentration thereof. Therefore, in the semiconductor device 800 in Patent Document No. 1, the hydrogen radical may undesirably be diffused to a portion of the oxide semiconductor layer 811 that is below the gate insulating layer 812 to decrease the resistance of the portion. The portion below the gate insulating layer 812 that has been decreased in resistance forms a parasitic capacitance together with the gate electrode 813. The parasitic capacitance becomes a load for driving.

The present invention made in light of the above-described problems has an object of, in a semiconductor device including an oxide semiconductor TFT of a top-gate structure, suppressing photodegradation of the oxide semiconductor layer caused by light incident on the oxide semiconductor TFT substrate from the rear side and also suppressing formation of a parasitic capacitance accompanying the gate electrode.

Solution to Problem

A semiconductor device according to an embodiment of the present invention includes a substrate; a thin film transistor supported by the substrate; a scanning line supplying a scanning signal to the thin film transistor; and a signal line supplying a display signal to the thin film transistor. The thin film transistor includes an oxide semiconductor layer including a channel region, and a first contact region and a second contact region respectively located to two sides of the channel region, a gate insulating layer provided so as to cover the oxide semiconductor layer, a gate electrode provided on the gate insulating layer, the gate electrode overlapping the channel region of the oxide semiconductor layer with the gate insulating layer being located between the gate electrode and the channel region, a source electrode electrically connected with the first contact region of the oxide semiconductor layer, and a drain electrode electrically connected with the second contact region of the oxide semiconductor layer. The semiconductor device further comprises a light blocking layer located between the oxide semiconductor layer and the substrate. The channel region is aligned to a portion of the light blocking layer that overlaps the oxide semiconductor layer.

In an embodiment, the gate electrode and the source electrode are formed of a same conductive film as each other.

In an embodiment, the drain electrode is formed of the same conductive film as that of the gate electrode and the source electrode.

In an embodiment, the semiconductor device further includes a pixel electrode electrically connected with the drain electrode, and a common electrode located above or below the pixel electrode. The signal line is formed of a conductive film same as that of the gate electrode and the source electrode. The scanning line includes a first portion formed of the same conductive film as that of the signal line and a second portion formed of a transparent conductive film same as that of the pixel electrode or the common electrode, the second portion being electrically connected with the first portion.

In an embodiment, the gate electrode is formed of a conductive film different from that of the source electrode and the drain electrode.

In an embodiment, the semiconductor device further includes a pixel electrode formed of a transparent conductive material, and a transparent connection electrode extending from the pixel electrode and in contact with the second contact region of the oxide semiconductor layer. The transparent connection electrode acts as the drain electrode.

In an embodiment, the light blocking layer is formed of a conductive material and is electrically connected with the scanning line.

In an embodiment, the light blocking layer is not electrically connected with the scanning line and is in an electrically floating state.

In an embodiment, the gate insulating layer includes a lower insulating layer covering a part of the oxide semiconductor layer, and an upper insulating layer formed of an insulating material different from that of the lower insulating layer, the upper insulating layer covering the lower insulating layer and the oxide semiconductor layer. The lower insulating layer is aligned to the light blocking layer.

In an embodiment, the upper insulating layer is a reducing insulating layer having a property of reducing an oxide semiconductor contained in the oxide semiconductor layer.

In an embodiment, the oxide semiconductor layer contains an In—Ga—Zn—O-based oxide.

In an embodiment, the In—Ga—Zn—O-based oxide includes a crystalline portion.

A method for producing a semiconductor device according to an embodiment of the present invention is a method for producing a semiconductor device including a thin film transistor. The thin film transistor includes an oxide semiconductor layer including a channel region, and a first contact region and a second contact region respectively located to two sides of the channel region, a gate insulating layer provided so as to cover the oxide semiconductor layer, a gate electrode provided on the gate insulating layer, the gate electrode overlapping the channel region of the oxide semiconductor layer with the gate insulating layer being located between the gate electrode and the channel region, a source electrode electrically connected with the first contact region of the oxide semiconductor layer, and a drain electrode electrically connected with the second contact region of the oxide semiconductor layer. The method includes step (A) of forming a light blocking layer on a substrate; step (B) of forming a first insulating layer covering the light blocking layer; step (C) of forming the oxide semiconductor layer, partially overlapping the light blocking layer, on the first insulating layer; step (D) of forming the gate insulating layer covering the oxide semiconductor layer; and step (E) of forming the gate electrode, overlapping the channel region of the oxide semiconductor layer, on the gate insulating layer. The channel region of the oxide semiconductor layer is formed in a self-aligned manner to a portion of the light blocking layer that overlaps the oxide semiconductor layer.

In an embodiment, the step (D) includes step (D-1) of forming a lower insulating layer covering a part of the oxide semiconductor layer, and step (D-2) of forming an upper insulating layer, covering the lower insulating layer and the oxide semiconductor layer, of an insulating material different from that of the lower insulating layer. In the step (D-1), the lower insulating layer is formed in a self-aligned manner to the light blocking layer.

In an embodiment, the step (D-1) includes step (D-1a) of forming an insulating film on the oxide semiconductor layer, and step (D-1b) of patterning the insulating film to form the lower insulating layer. The step (D-1b) includes a step of performing exposure using the light blocking layer as a mask.

In an embodiment, the upper insulating layer is a reducing insulating layer having a property of reducing an oxide semiconductor contained in the oxide semiconductor layer. A portion of the oxide semiconductor layer that is covered with the lower insulating layer becomes the channel region.

Advantageous Effects of Invention

According to an embodiment of the present invention, in a semiconductor device including an oxide semiconductor TFT of a top-gate structure, photodegradation of an oxide semiconductor layer caused by light incident on the oxide semiconductor TFT substrate from the rear side, and formation of a parasitic capacitance accompanying a gate electrode, are suppressed.

DESCRIPTION OF EMBODIMENTS

Prior to describing embodiments of the present invention, a degradation phenomenon of an oxide semiconductor layer caused by light directed thereto will be described.

Figure 17:
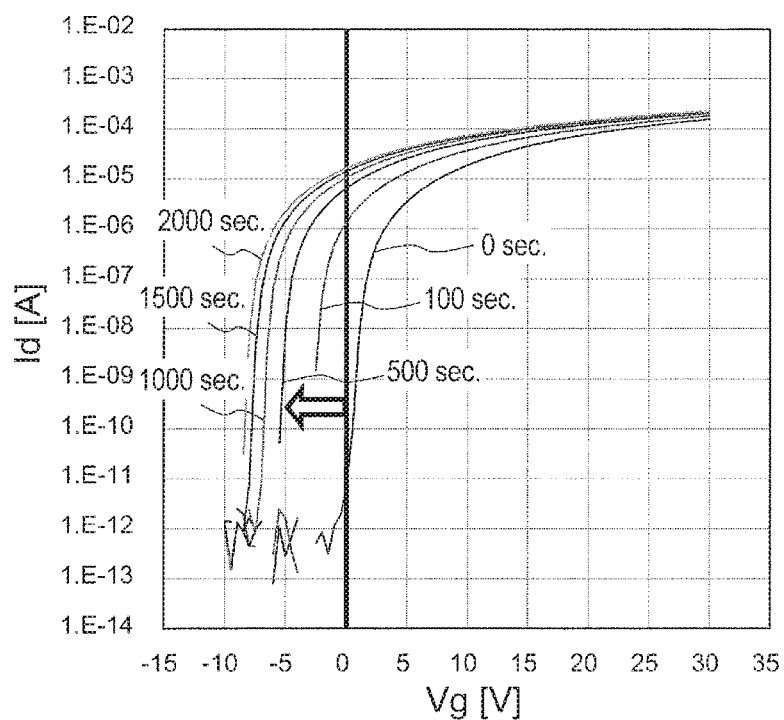
FIG. 17 is a graph showing a gate voltage vs. drain current characteristic (relationship between the gate voltage Vg and the drain current Id) obtained by a test, performed on an oxide semiconductor TFT of certain specifications, of applying a negative bias to an oxide semiconductor layer for a predetermined time duration while directing light toward a channel region of the oxide semiconductor layer.

When an oxide semiconductor layer is supplied with a negative bias while the channel region is irradiated with light, a degradation phenomenon that a threshold voltage is shifted in a negative direction occurs. FIG. 17 is a graph showing a gate voltage vs. drain current characteristic (relationship between the gate voltage Vd and the drain current Id) obtained by a test, performed on an oxide semiconductor TFT of certain specifications, of applying a negative bias to the oxide semiconductor layer for a certain time duration while directing light toward a channel region of the oxide semiconductor layer. The test conditions are as shown in Table 1 below.

TABLE 1

| GATE VOLTAGE Vg | −30 V |
| DRAIN VOLTAGE Vd | 0 V |
| TEMPERATURE | 60° C. |
| ILLUMINANCE OF LIGHT | 10000 lx |
| LIGHT SOURCE | WHITE LED |

FIG. 17 shows the gate voltage vs. drain current characteristic when the negative bias is applied for 0 sec., 100 sec., 500 sec., 1000 sec., 1500 sec., and 2000 sec. It is seen from FIG. 17 that as the time duration of application of the negative bias is extended, the threshold voltage is shifted more in the negative direction. If such a degradation occurs conspicuously in the TFT (pixel TFT) provided in each of pixels, the potential of the pixel electrode is not retained sufficiently. This causes flicker or display nonuniformity to be visually recognized.

Figure 18:
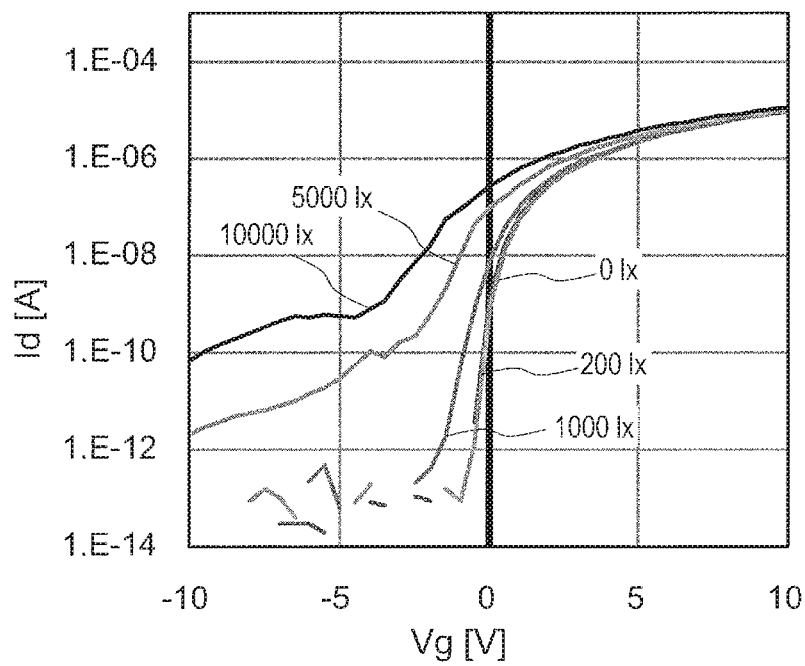
FIG. 18 is a graph showing a change in the gate voltage vs. drain current characteristic occurring when the illuminance of the light to be directed toward the channel region of the oxide semiconductor layer is changed.

When light is directed toward the channel region, the off-current (leak current when the TFT is off) is increased. As the illuminance of the light is higher, the degree by which the off-current is increased is higher. FIG. 18 is a graph showing a change in the gate voltage vs. drain current characteristic occurring when the illuminance of the light to be directed toward the channel region is changed.

FIG. 18 shows the gate voltage vs. drain current characteristic when the illuminance is 0 1x (dark environment), 200 1x, 1000 1x, 5000 1x, and 10000 1x. It is seen from FIG. 18 that as the illuminance is higher, the off-current is larger.

As described above, the degradation phenomena that the threshold voltage is shifted in the negative direction and that the off-current is increased are caused by light directed toward the channel region of the oxide semiconductor layer.

Hereinafter, semiconductor devices according to embodiments of the present invention will be described with reference to the drawings. A semiconductor device according to an embodiment of the present invention may be any device including a thin film transistor on a substrate, and encompasses various circuit boards, various TFT substrates, and various display apparatuses including a TFT substrate. Herein, a TFT substrate for a liquid crystal display apparatus will be described as an example. The TFT substrate according to an embodiment of the present invention is usable for another display apparatus (e.g., an MEMS (Micro Electro Mechanical System) display apparatus or an organic EL (Electroluminescence) display apparatus).

Embodiment 1

Figure 1:
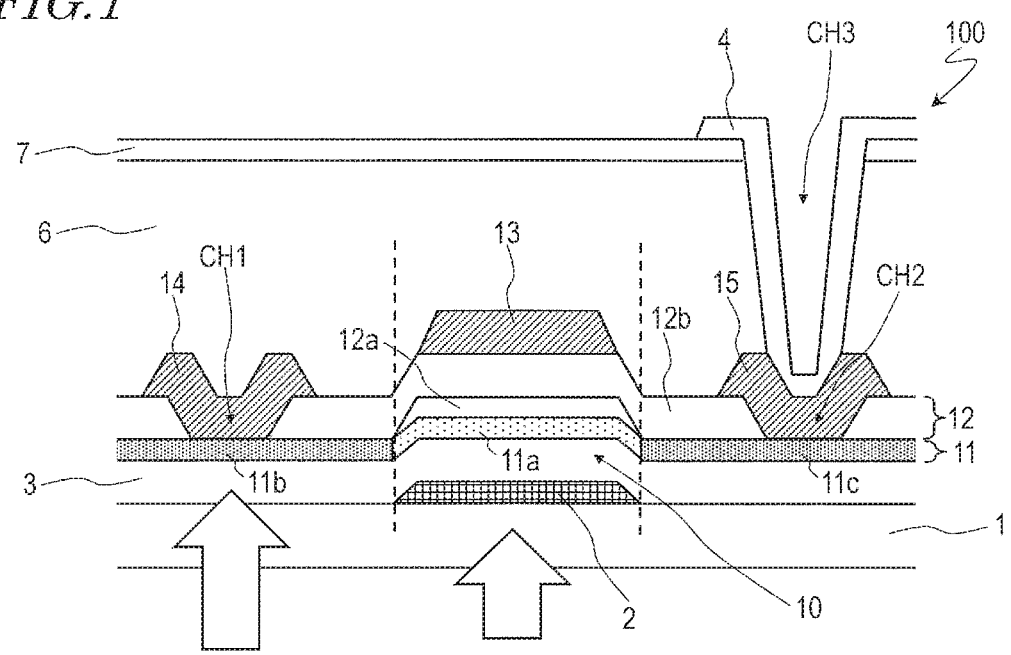
FIG. 1 is a view schematically showing a semiconductor device 100 according to an embodiment of the present invention, and is a cross-sectional view taken along line 1A-1A' in FIG. 3.
Figure 2:
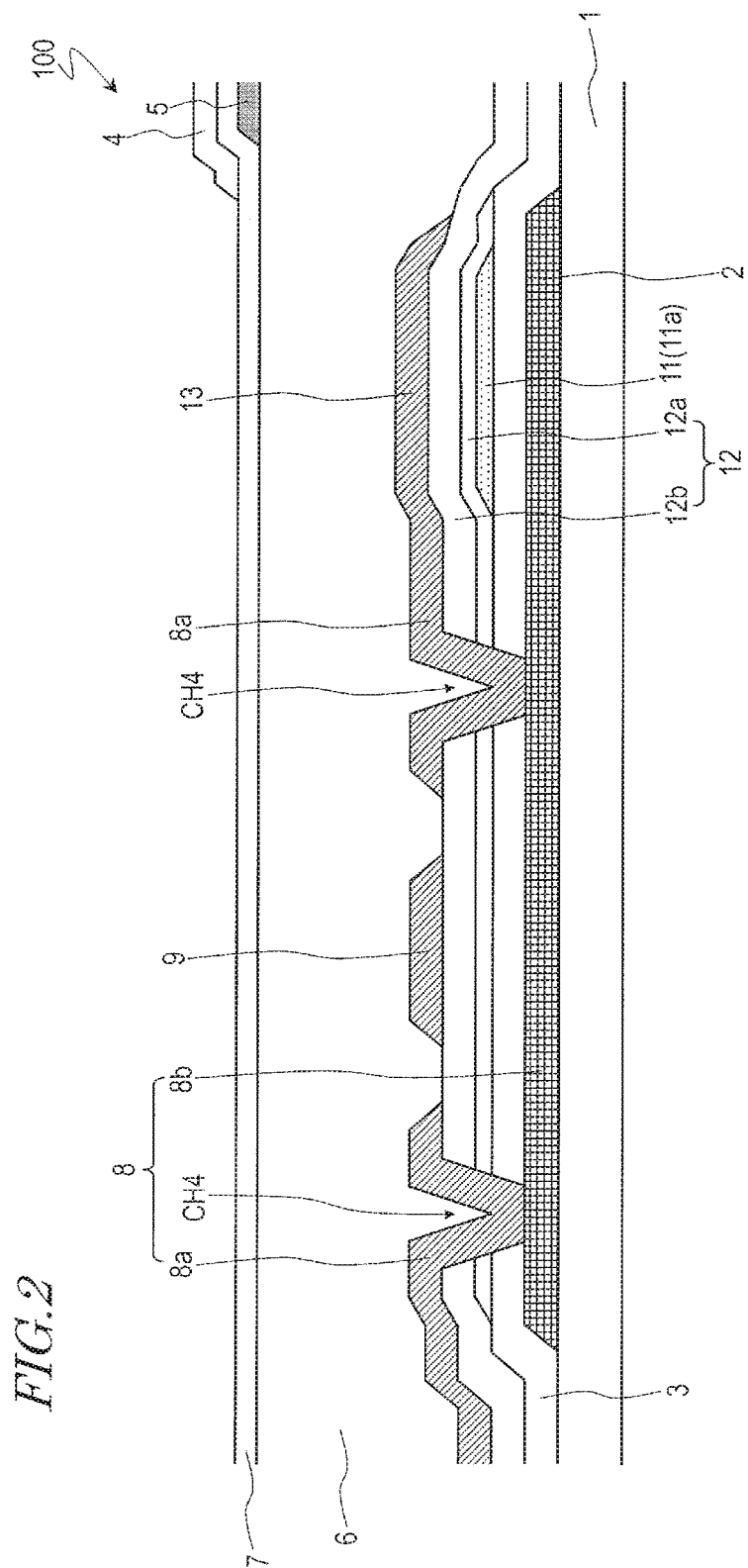
FIG. 2 is a view schematically showing the semiconductor device 100, and is a cross-sectional view taken along line 2A-2A' in FIG. 3.
Figure 3:
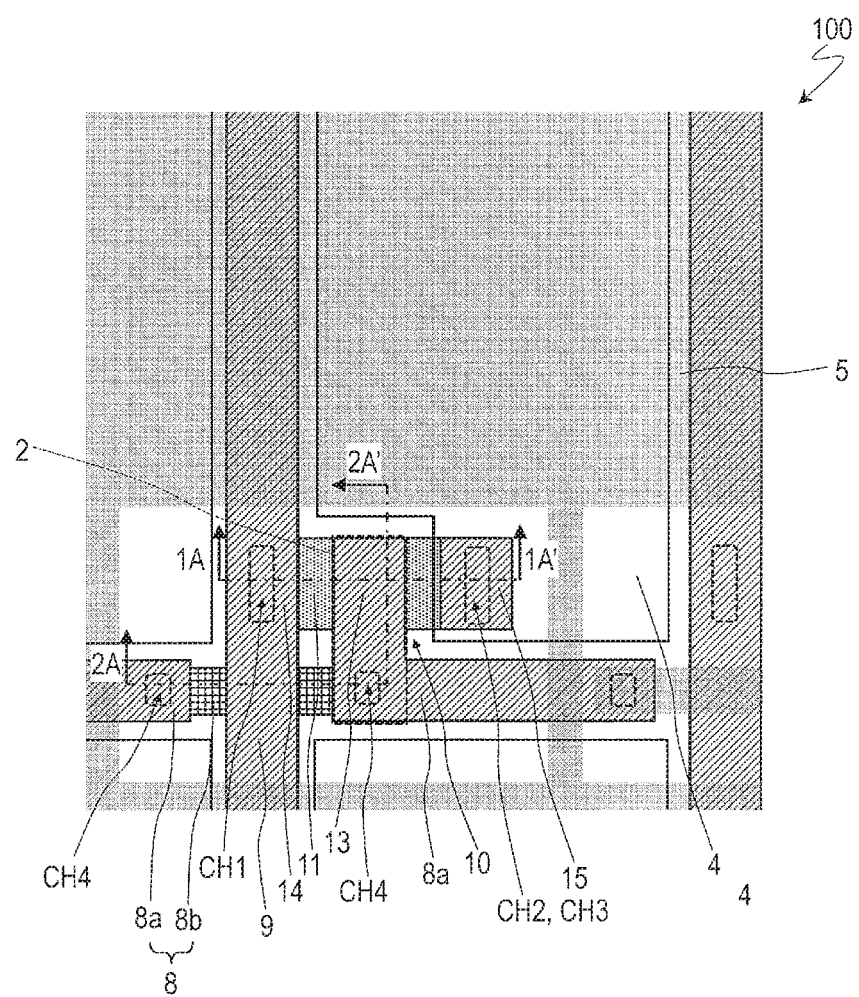
FIG. 3 is a plan view schematically showing the semiconductor device 100.
Figure 4:
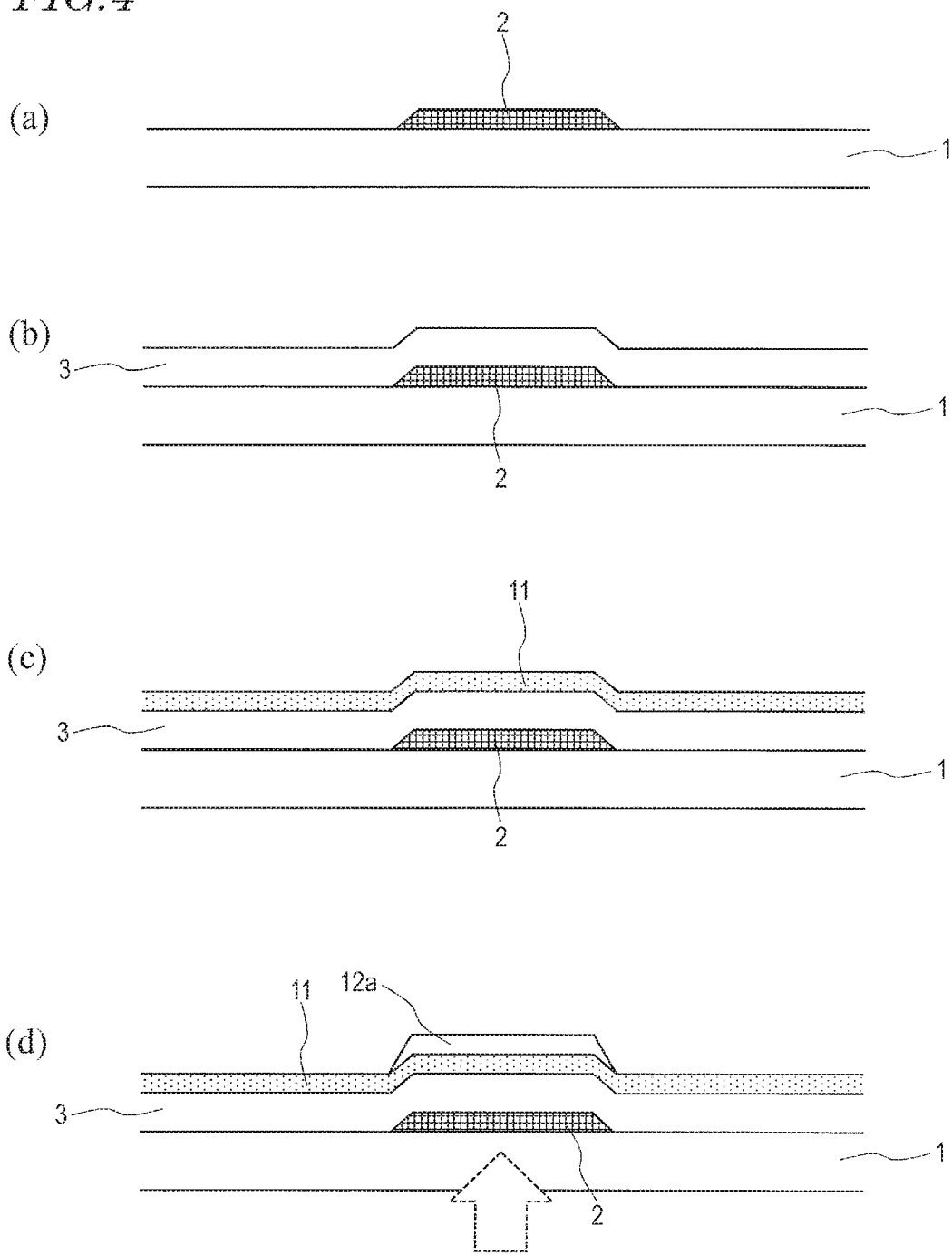
FIG. 4(a) through FIG. 4(d) are each a cross-sectional view showing a step for producing the semiconductor device 100.
Figure 5:
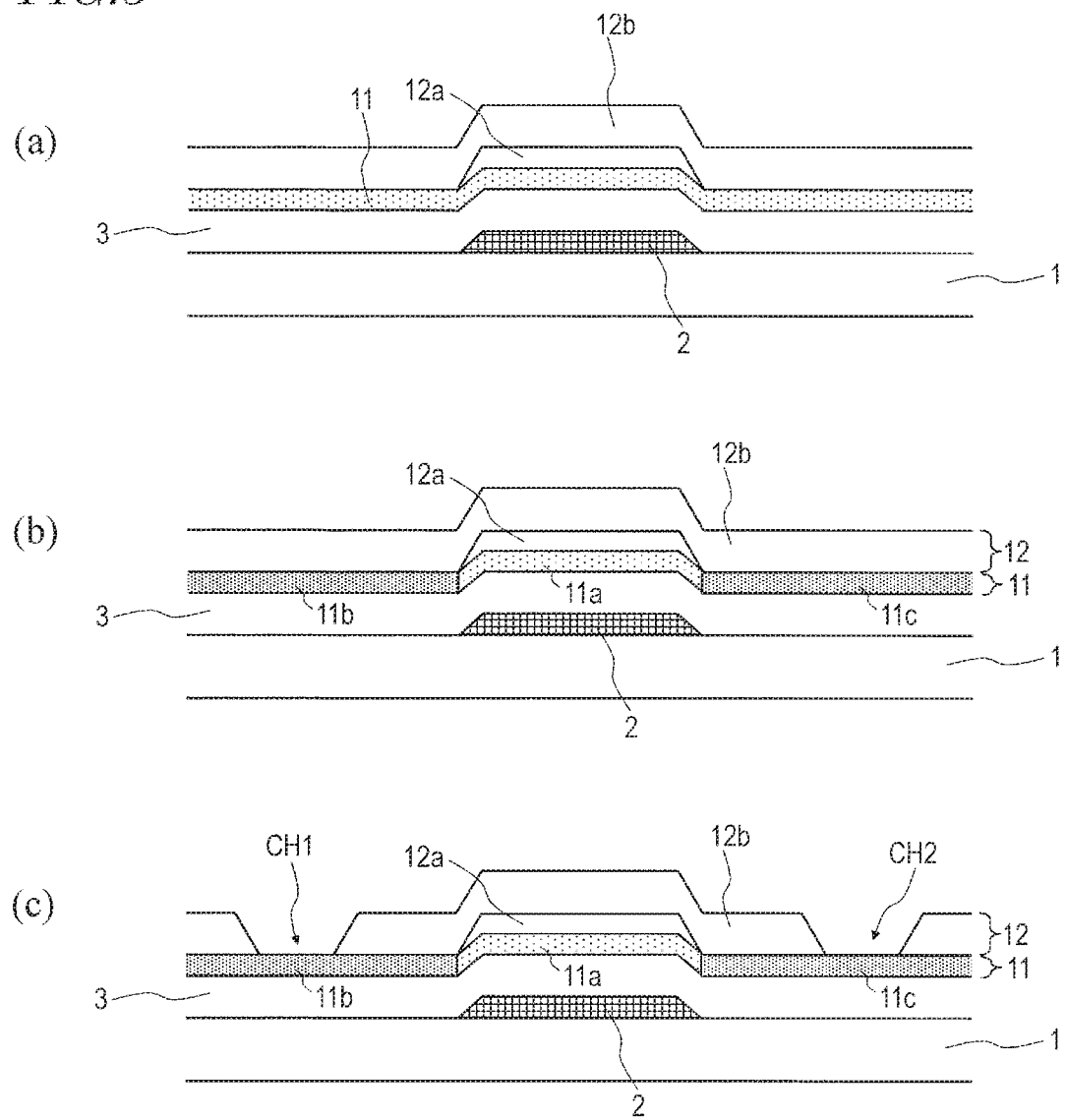
FIG. 5(a) through FIG. 5(c) are each a cross-sectional view showing a step for producing the semiconductor device 100.
Figure 6:
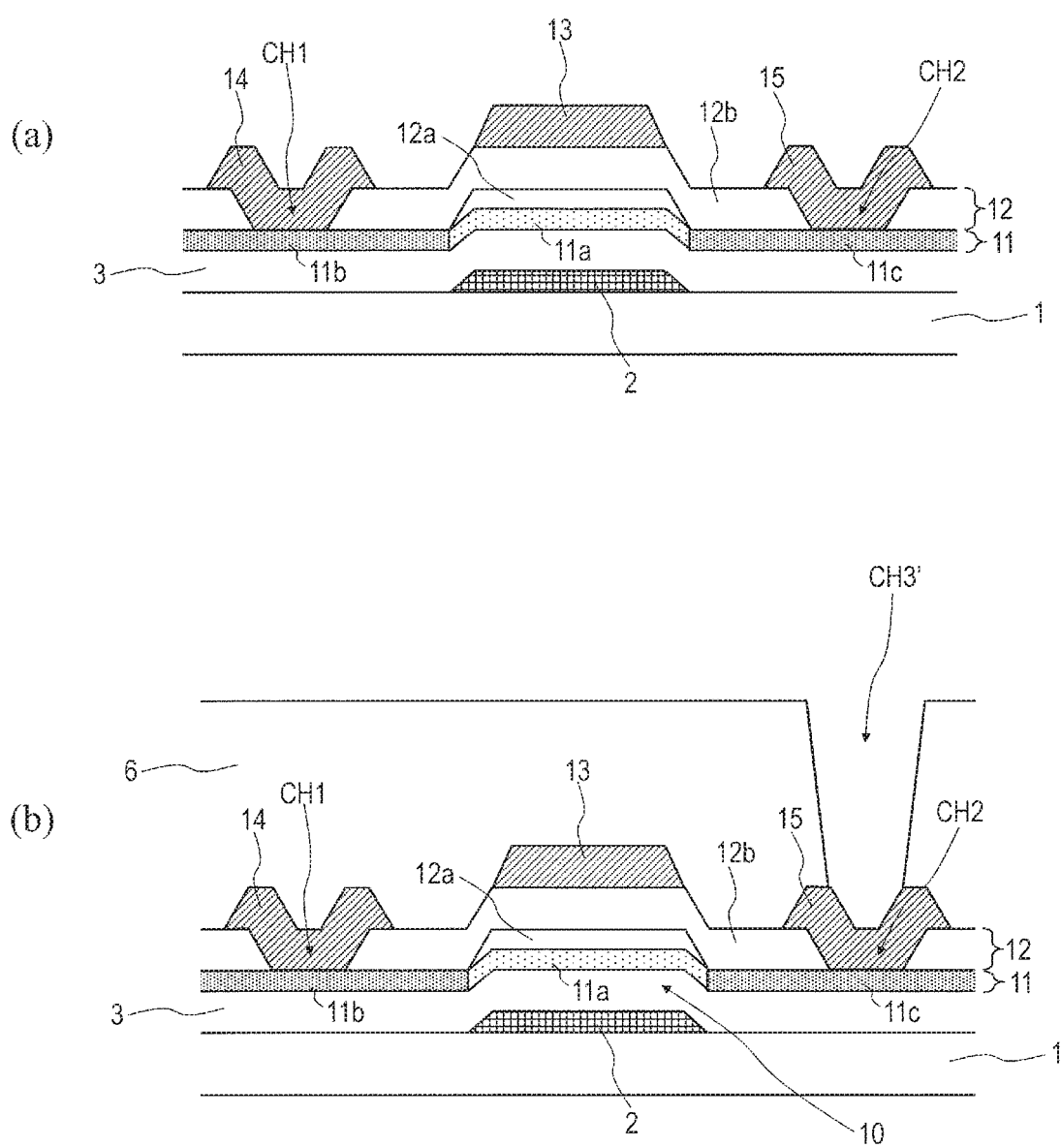
FIG. 6(a) and FIG. 6(b) are each a cross-sectional view showing a step for producing the semiconductor device 100.
Figure 7:
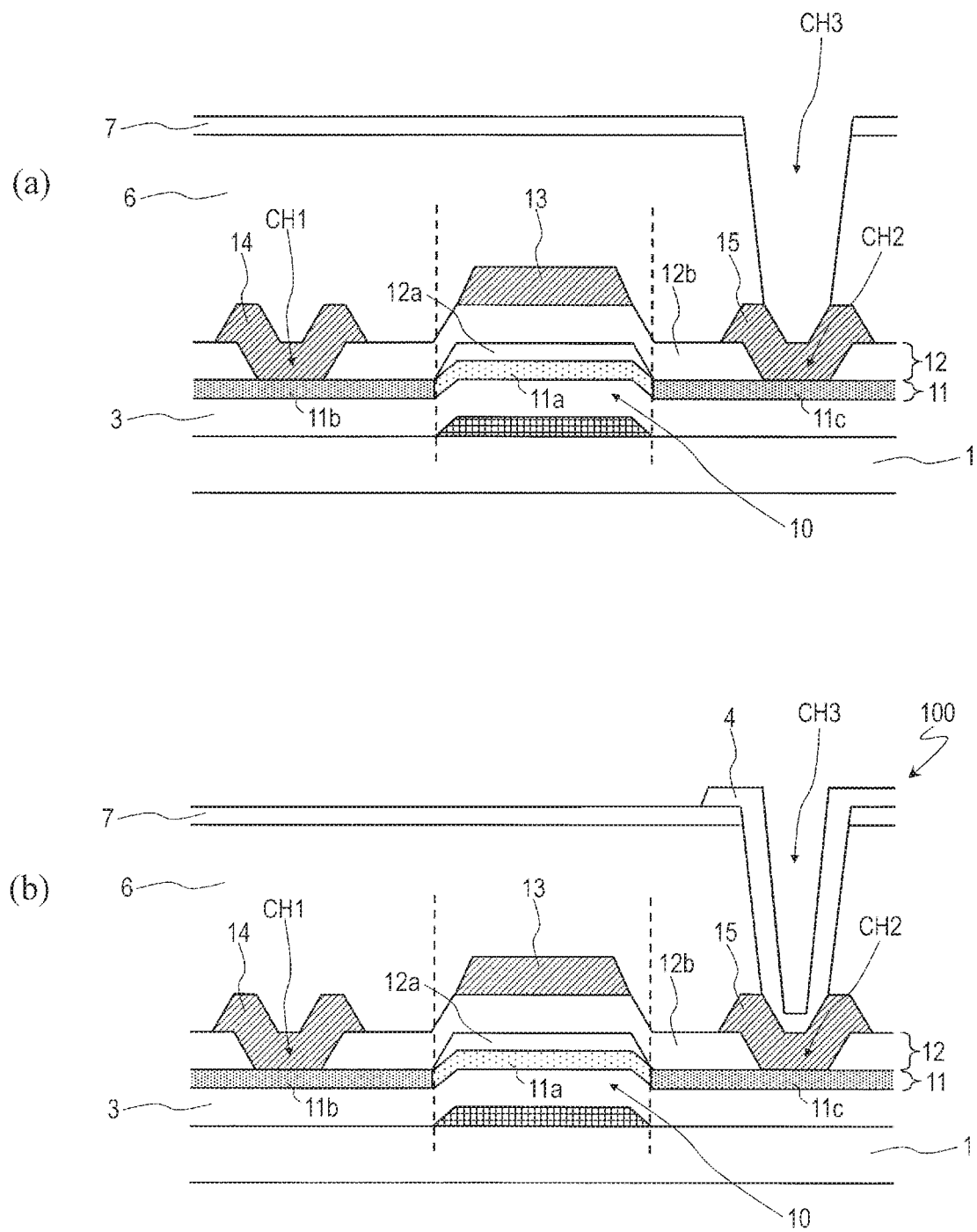
FIG. 7(a) and FIG. 7(b) are each a cross-sectional view showing a step for producing the semiconductor device 100.

FIG. 1, FIG. 2 and FIG. 3 each show a semiconductor device (TFT substrate) 100 according to this embodiment. FIG. 1 and FIG. 2 are each a cross-sectional view schematically showing the semiconductor device 100. FIG. 3 is a plan view schematically showing the semiconductor device 100. FIG. 1 and FIG. 2 respectively show cross-sectional structures taken along lines 1A-1A' and 2A-2A' in FIG. 3.

As shown in FIG. 1, FIG. 2 and FIG. 3, the semiconductor device 100 includes a substrate 1, a thin film transistor (TFT) 10 supported by the substrate 1, a scanning line 8 supplying a scanning signal to the TFT 10, and a signal line 9 supplying a display signal to the TFT 10. The substrate 1 is an insulating transparent substrate, and is, for example, a glass substrate. The TFT 10 is provided in each of a plurality of pixels.

The TFT 10 has a top-gate structure. The TFT 10 includes an oxide semiconductor layer 11, a gate insulating layer 12, a gate electrode 13, a source electrode 14 and a drain electrode 15.

The oxide semiconductor layer 11 is formed on a base coat layer (first insulating layer) 3 described below. The oxide semiconductor layer 11 includes a channel region 11$a$, a first contact region (source contact region) 11$b$ and a second contact region (drain contact region) 11$c$. The source contact region 11$b$ and the drain contact region 11$c$ are respectively located to two sides of the channel region 11$a$.

The gate insulating layer 12 is provided so as to cover the oxide semiconductor layer 11. In this embodiment, the gate insulating layer 12 has a stack structure. Specifically, the gate insulating layer 12 includes a lower insulating layer 12$a$ and an upper insulating layer 12$b$. The lower insulating layer 12$a$ covers a part (only a part) of the oxide semiconductor layer 11. More specifically, the lower insulating layer 12$a$ covers only the channel region 11$a$ of the oxide semiconductor layer 11, and is in contact with the channel region 11$a$. The upper insulating layer 12$b$ is formed of an insulating material different from that of the lower insulating layer 12$a$, and is a reducing insulating layer having a property of reducing an oxide semiconductor contained in the oxide semiconductor layer 11. The upper insulating layer 12$b$ covers the lower insulating layer 12$a$ and the oxide semiconductor layer 11, and is in contact with a portion of the oxide semiconductor layer 11 other than the channel region 11$a$.

The gate electrode 13 is provided on the gate insulating layer 12. The gate electrode 13 overlaps the channel region 11$a$ of the oxide semiconductor layer 11 with the gate insulating layer 12 being located between the gate electrode 13 and the channel region 11$a$.

The source electrode 14 is electrically connected with the source contact region 11$b$ of the oxide semiconductor layer 11. In the gate insulating layer 12, a contact hole CH1 exposing the source contact region 11$b$ is formed. The source electrode 14 is connected with the source contact region 11$b$ in the contact hole CH1.

The drain electrode 15 is electrically connected with the drain contact region 11$c$ of the oxide semiconductor layer 11. In the gate insulating layer 12, a contact hole CH2 exposing the drain contact region 11$c$ is formed. The drain electrode 15 is connected with the drain contact region 11$c$ in the contact hole CH2.

In this embodiment, the gate electrode 13 is formed of the same conductive film as that of the source electrode 14 and the drain electrode 15. Namely, during the production of the semiconductor device 100, the gate electrode 13, the source electrode 14 and the drain electrode 15 are formed at the same time by patterning the same conductive film.

The semiconductor device 100 according to this embodiment further includes a pixel electrode 4 and a common electrode 5.

The pixel electrode 4 is provided in each of the pixels. The pixel electrode 4 is electrically connected with the drain electrode 15. The pixel electrode 4 is formed of a transparent conductive material.

The common electrode 5 is located below the pixel electrode 4, and is provided commonly to the pixels. Namely, the common electrode 5 is formed in the entirety of a display region including the plurality of pixels. The common electrode 5 is not formed in the vicinity of the TFTs 10. The common electrode 5 is formed of a transparent conductive material.

An interlayer insulating layer (second insulating layer) 6 is provided so as to cover the gate electrode 13, the source electrode 14, and the drain electrode 15. The common electrode 5 is formed on the interlayer insulating layer 6. A dielectric layer (third insulating layer) 7 is provided so as to cover the common electrode 5. The pixel electrode 4 is formed on the dielectric layer 7. In the interlayer insulating layer 6 and the dielectric layer 7, a contact hole CH3 exposing at least a part of the drain electrode 15 is formed. The pixel electrode 15 is connected with the drain electrode 15 in the contact hole CH3.

The signal line 9 is electrically connected with the source electrode 14. The signal line 9 is formed of the same conductive film as that of the gate electrode 13, the source electrode 14 and the drain electrode 15. In the example shown here, the oxide semiconductor 11 is located so as to partially overlap the signal line 9, and a portion of the signal line 9 that overlaps the oxide semiconductor layer 11 acts as the source electrode 14.

The scanning line 8 is electrically connected with the gate electrode 13. The scanning line 8 includes a first portion (upper layer line) 8$a$ formed of the same conductive film as that of the signal line 9 and a second portion (lower layer line) 8$b$ formed of the same conductive film as that of a light blocking layer 2 described below. The first portion 8$a$ and the second portion 8$b$ are electrically connected with each other. In the base coat layer 3 and the gate insulating layer 12, a contact hole CH4 exposing a part of the second portion 8$b$ is formed. The first portion 8$a$ is connected with the second portion 8$b$ in the contact hole CH4. In a region where the scanning line 8 crosses the signal line 9, only the second portion 8$b$ is provided as the scanning line 8, and the second portion 8$b$ crosses the signal line 9 with the base coat layer 3 and the gate insulating layer 12 being located between the second portion 8$b$ and the signal line 9. Namely, a structure for connection to the second portion 8$b$, which is in a different layer from that of the first portion 8$a$, is provided.

The semiconductor device 100 according to this embodiment further includes the light blocking layer 2.

The light blocking layer 2 is located between the oxide semiconductor layer 11 and the substrate 1. As shown in FIG. 1, the channel region 11$a$ of the oxide semiconductor layer 11 is aligned to a portion of the light blocking layer 2 that overlaps the oxide semiconductor layer 11. In other words, the channel region 11$a$ is formed in a self-aligned manner to the portion of the light blocking layer 2 that overlaps the oxide semiconductor layer 11. In still other words, as seen in a direction normal to a substrate surface, an end of the channel region 11$a$ in a channel length direction substantially matches an end surface of the light blocking layer 2 in the channel length direction. The lower insulating layer 12$a$ of the gate insulating layer 12 is aligned to the light blocking layer 11. In other words, the lower insulating layer 12$a$ is formed in a self-aligned manner to the light blocking layer 2. In still other words, as seen in the direction normal to the substrate surface, an end of the lower insulating layer 12a substantially matches the end surface of the light blocking layer 2.

In this embodiment, the light blocking layer 2 is formed of a conductive material, and is electrically connected with the scanning line 8. Specifically, as shown in FIG. 2, the second portion 8b of the scanning line 8 extends from the light blocking layer 2.

As described above, the semiconductor device 100 according to this embodiment includes the light blocking layer 2 located between the oxide semiconductor layer 11 and the substrate 1. Therefore, light (see FIG. 1) is prevented from being incident on the channel region 11a of the oxide semiconductor layer 11 from the rear side. With such a structure, photodegradation of the oxide semiconductor layer 11 is suppressed. In the case where the semiconductor device 100 is used in a liquid crystal display apparatus, it is not necessary to put a limitation on the luminance of the backlight unit for the reason of the photodegradation of the oxide semiconductor layer 11. Therefore, the luminance of the backlight unit may be made sufficiently high, and thus a sufficient level of visual recognizability is provided when the liquid crystal display apparatus is used outdoors.

In the semiconductor device 100 according to this embodiment, the channel region 11a of the oxide semiconductor layer 11 is aligned to the portion of the light blocking layer 2 that overlaps the oxide semiconductor layer 11. Namely, as seen in the direction normal to the surface of the substrate 1, the light blocking layer 2 overlaps neither the source contact region 11b nor the drain contact region 11c of the oxide semiconductor layer 11. Therefore, the parasitic capacitance between the light blocking layer 2 and the source contact region 11b/the drain contact region 11c is decreased. If the light blocking layer 2 significantly overlaps the source contact region 11b/the drain contact region 11c, the parasitic capacitance is increased, which may undesirably become a load for driving.

In the semiconductor device 100 according to this embodiment, the gate electrode 13 is formed of the same conductive film as that of the source electrode 14 and the drain electrode 15. Therefore, as compared with the case where the gate electrode 13 is formed of a conductive film different from that of the source electrode 14 and the drain electrode 15, a part of production steps may be omitted, and thus the productivity is raised.

In the semiconductor device 100 according to this embodiment, formation of the parasitic capacitance accompanying the gate electrode 13 is suppressed. This will be described in detail below.

In the case where the light blocking layer 2 is formed of a conductive material and is electrically connected with the scanning line 8 as in this embodiment, the light blocking layer 2 is also supplied with a gate potential. Therefore, the light blocking layer 2 may act as another gate electrode (back-gate electrode). This increases the on-current, which is advantageous in the case where the pixel capacitance is large and also in the case where the charge time duration (horizontal scanning duration) is made short due to high speed driving or the like.

<Regarding the Oxide Semiconductor Layer>

Now, the oxide semiconductor layer 11 used in this embodiment will be described.

The "oxide semiconductor layer" as used in this specification is a layer including a semiconductor region acting as an active layer of an oxide semiconductor TFT. The oxide semiconductor layer may partially include a region having a low resistance (low resistance region or conductive region).

In the case where, for example, the oxide semiconductor layer is in contact with a conductive layer such as a metal layer or the like or a reducing insulating layer, a portion of a surface of the oxide semiconductor layer that is in contact with the conductive layer becomes a low resistance region having an electric resistance lower than that of the semiconductor region. There may be a case where only the surface of the oxide semiconductor layer is decreased in resistance, or there may be a case where a portion of the oxide semiconductor layer extending over a certain thickness is decreased in resistance.

An oxide semiconductor contained in the semiconductor region of the oxide semiconductor layer 11 may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c axis aligned generally perpendicular to a layer surface, and the like.

The oxide semiconductor layer 11 may have a stack structure including two or more layers. In the case of having a stack structure, the oxide semiconductor layer 11 may include a non-crystalline oxide semiconductor layer and a crystalline oxide semiconductor. Alternatively, the oxide semiconductor layer 11 may include a plurality of crystalline oxide semiconductor layers having different crystalline structures. Still alternatively, the oxide semiconductor layer 11 may include a plurality of non-crystalline oxide semiconductor layers. In the case where the oxide semiconductor layer 11 has a two-layer structure including an upper layer and a lower layer, it is preferred that the energy gap of the oxide semiconductor contained in the upper layer is larger than the energy gap of the oxide semiconductor contained in the lower layer. It should be noted that the energy gap of the oxide semiconductor contained in the lower layer may be larger than the energy gap of the oxide semiconductor contained in the upper layer as long as the energy gap difference between these layers is relatively small.

The material, structure, and film formation method of the non-crystalline oxide semiconductor and the above-described types of crystalline oxide semiconductors, the structure of the oxide semiconductor layers having a stack structure, and the like are described in, for example, Japanese Laid-Open Patent Publication No. 2014-003799. The entirety of the disclosure of Japanese Laid-Open Patent Publication No. 2014-003799 is incorporated herein by reference.

The oxide semiconductor layer 11 may contain, for example, at least one metal element among In, Ga and Zn. In this embodiment, the oxide semiconductor layer 11 contains an In—Ga—Zn—O-based semiconductor (e.g., indium gallium zinc oxide). The In—Ga—Zn—O-based semiconductor is a three-component oxide of In (indium), Ga (gallium) and Zn (zinc). There is no specific limitation on the ratio (composition ratio) among In, Ga and Zn. The ratio may be, for example, In:Ga:Zn=2:2:1, In:Ga:Zn=1:1:1, In:Ga:Zn=1:1:2, or the like. The oxide semiconductor layer 11 may be formed of an oxide semiconductor film containing an In—Ga—Zn—O-based semiconductor.

The In—Ga—Zn—O-based semiconductor may be amorphous or crystalline. A preferred crystalline In—Ga—Zn—O-based semiconductor is a crystalline In—Ga—Zn—O-based semiconductor having a c axis aligned generally perpendicular to a layer surface.

The crystalline structure of the crystalline In—Ga—Zn—O-based semiconductor is disclosed in, for example, Japanese Laid-Open Patent Publication No. 2014-007399 mentioned above, Japanese Laid-Open Patent Publication No. 2012-134475, Japanese Laid-Open Patent Publication No. 2014-209727 and the like. The entirety of the disclosures of Japanese Laid-Open Patent Publication No. 2012-134475 and Japanese Laid-Open Patent Publication No. 2014-209727 is incorporated herein by reference. A TFT including an In—Ga—Zn—O-based semiconductor layer has a high mobility (20 times the mobility of a-SiTFT) and a low leak current (less than $\frac{1}{100}$ of the leak current of a-SiTFT). Therefore, such a TFT is preferably usable as a driving TFT (e.g., TFT included in a driving circuit provided in the vicinity of a display region including a plurality of pixels, on the same substrate as the display region) or a pixel TFT (TFT provided in a pixel).

The oxide semiconductor layer 11 may contain another oxide semiconductor instead of the In—Ga—Zn—O-based semiconductor. The oxide semiconductor layer 11 may contain, for example, an In—Sn—Zn—O-based semiconductor (e.g., $In_2O_3$—$SnO_2$—ZnO; InSnZnO). The In—Sn—Zn—O-based semiconductor is a three-component oxide of In (indium), Sn (tin) and Zn (zinc). Alternatively, the oxide semiconductor layer 11 may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

<Method for Producing the Semiconductor Device>

With reference to FIG. 4 through FIG. 7, an example of method for producing the semiconductor device 100 will be described. FIG. 4 through FIG. 7 each provide cross-sectional views showing steps for producing the semiconductor device 100.

First, as shown in FIG. 4(a), the light blocking layer 2 is formed on the substrate 1. In this step, the second portion (lower layer line) 8b of the scanning line 8 is also formed. Specifically, a conductive film (having a thickness of, for example, 30 nm or greater and 150 nm or less) is formed on the substrate 1 by, for example, sputtering, and then the conductive film is patterned by a photolithography process, so that the light blocking layer 2 and the second portion 8b of the scanning line 8 are obtained. The substrate 1 may be, for example, a glass substrate or a heat-resistant plastic substrate (resin substrate). The material of the light blocking layer 2 may be a metal material such as molybdenum (Mo), tungsten (W), titanium (Ti), tantalum (Ta) or the like, or an alloy thereof.

Next, as shown in FIG. 4(b), the base coat layer (first insulating layer) 3 covering the light blocking layer 2 is formed. Specifically, an insulating film is deposited by, for example, CVD so as to cover the light blocking layer 2, so that the base coat layer 3 is obtained. As the base coat layer 3, a silicon oxide ($SiO_2$) layer, a silicon nitride ($SiN_x$) layer, a silicon oxide nitride ($SiO_xN_y$; x>y) layer, a silicon nitride oxide ($SiN_xO_y$; x>y) layer, or the like, for example, is appropriately usable. The base coat layer 3 may have a stack structure including a lower layer and an upper layer stacked from the substrate 1 side. It is preferred that, for example, a silicon nitride layer is formed as the lower layer in order to prevent diffusion of impurities or the like from the substrate 1 and that a silicon oxide layer is formed as the upper layer in order to guarantee an insulating property. In this case, the lower layer and the upper layer each have a thickness of, for example, 50 nm or greater and 100 nm or less.

Next, as shown in FIG. 4(c), the oxide semiconductor layer 11 partially overlapping the light blocking layer 2 is formed on the base coat layer 3. Specifically, an oxide semiconductor film (having a thickness of, for example, 5 nm or greater and 70 nm or less) is deposited on the base coat layer 3 by, for example, sputtering, and then the oxide semiconductor film is patterned, so that the oxide semiconductor layer 11 is obtained in an island shape.

Then, as shown in FIG. 4(d), the lower insulating layer 12a covering a part of the oxide semiconductor layer 11 is formed. Specifically, an insulating film is deposited on the oxide semiconductor layer 11 by, for example, CVD, and then the insulating film is patterned, so that the lower insulating layer 12a is obtained. The step of patterning the insulating film includes a step of performing exposure using the light blocking layer 2 as a mask (rear surface exposure step). With such a step, the lower insulating layer 12a is formed in a self-aligned manner to the light blocking layer 2.

Next, as shown in FIG. 5(a), the upper insulating layer 12b covering the lower insulating layer 12a and the oxide semiconductor layer 11 is formed of an insulating material different from that of the lower insulating layer 12a. Specifically, an insulating film (having a thickness of, for example, 50 nm or greater and 300 nm or less) is deposited on the lower insulating layer 12a and the oxide semiconductor layer 11 by, for example, CVD, so that the upper insulating layer 12b is obtained. The upper insulating layer 12b is a reducing insulating layer having a property of reducing the oxide semiconductor contained in the oxide semiconductor layer 11. Herein, a silicon nitride layer is used as the upper insulating layer 12b, which is a reducing insulating layer.

Next, as shown in FIG. 5(b), annealing is performed at a predetermined temperature (e.g., 200° C. or higher and 400° C. or lower). In this step, hydrogen contained in the upper insulating layer (silicon nitride layer) 12b is diffused to the oxide semiconductor layer 11. Therefore, the carrier concentration of a portion of a top surface of the oxide semiconductor layer 11 that is in contact with a bottom surface of the upper insulating layer 12b is increased, and thus this portion is decreased in resistance. In this step, a portion of the oxide semiconductor layer 11 extending over a predetermined thickness from the top surface (e.g., 0.1 μm to 1.0 μm although the thickness depends on the annealing conditions or the like) is decreased in resistance. As a result, the source contact region 11b and the drain contact region 11c are formed. The portion of the oxide semiconductor layer 11 that is covered with the lower insulating layer 12b becomes the channel region 11a. Namely, the channel region 11a is formed in a self-aligned manner to the lower insulating layer 12b and the portion of the light blocking layer 2 that overlaps the oxide semiconductor layer 11.

Then, as shown in FIG. 5(c), the contact holes CH1 and CH2 exposing the source contact region 11b and the drain contact region 11c are formed in the gate insulating layer 12 by, for example, etching.

Next, as shown in FIG. 6(a), the gate electrode 13, the source electrode 14 and the drain electrode 15 are formed on the gate insulating layer 12. In this step, the signal line 9 and the first portion (upper layer line) 8a of the scanning liner 8 are also formed. Specifically, a conductive film (having a thickness of, for example, 100 nm or greater and 600 nm or less) is formed on the gate insulating layer 12 by, for example, sputtering, and then the conductive film is patterned by a photolithography process. As a result, the gate electrode 13, the source electrode 14, the drain electrode 15, the signal line 9 and the first portion 8a of the scanning line 8 are obtained. The gate electrode 13 is formed so as to overlap the channel region 11a of the oxide semiconductor layer 11. The source electrode 14 and the drain electrode 15 are formed such that portions thereof are respectively located in the contact holes CH1 and CH2. As the conductive film that is to be formed into the gate electrode 13, the source electrode 14, the drain electrode 15 and the like, a film containing a metal material such as aluminum (Al), tungsten (W), molybdenum (Mo), tantalum (Ta), copper (Cu), chromium (Cr), titanium (Ti) or the like or an alloy thereof, for example, is appropriately usable. A stack film including a plurality of such films in a stacked manner may be used.

Next, as shown in FIG. 6(b), the interlayer insulating layer 6 covering the gate electrode 13, the source electrode 14, the drain electrode 15 and the like is formed. Then, an opening CH3' exposing at least a part of the drain electrode 15 is formed in the interlayer insulating layer 6. The interlayer insulating layer 6 is, for example, an organic insulating film (having a thickness of, for example, 1000 nm or greater and 3000 nm or less). As a material of the organic insulating film, a photosensitive resin material is preferably usable. The interlayer insulating layer 6 may be an inorganic insulating film (having a thickness of, for example, 500 nm or greater and 800 nm or less). The interlayer insulating layer 6 may have a stack structure including an organic insulating film and an inorganic insulating film.

Next, the common electrode 5 is formed on the interlayer insulating layer 6. Specifically, a transparent conductive film (having a thickness of, for example, 20 nm or greater and 300 nm or less) is formed on the interlayer insulating layer 6 by, for example, sputtering, and the transparent conductive film is patterned, so that the common electrode 5 is obtained. As the transparent conductive material to be formed into the common electrode 5, an oxide semiconductor such as ITO, IZO, ZnO or the like is usable.

Next, as shown in FIG. 7(a), the dielectric layer 7 covering the common electrode 5 is formed. Specifically, an insulating film (having a thickness of, for example, 50 nm or greater and 300 nm or less) is deposited by, for example, CVD, so that the dielectric layer 7 is obtained. As a material of the dielectric layer 7, an inorganic insulating material such as, for example, a silicon nitride film, a silicon oxide film or the like is usable. Then, an opening exposing at least a part of the drain electrode 15 is formed in the dielectric layer 7. The opening and the opening CH3' in the interlayer insulating layer 6 form the contact hole CH3.

Next, as shown in FIG. 7(b), the pixel electrode 4 is formed on the dielectric layer 7. Specifically, a transparent conductive film (having a thickness of, for example, 20 nm or greater and 300 nm or less) is deposited by, for example, sputtering, and the transparent conductive film is patterned, so that the pixel electrode 4 is obtained. In the pixel electrode 4 formed in each of the pixels, at least one slit (opening) may be formed. As the transparent conductive material that is to be formed into the pixel electrode 4, an oxide semiconductor such as ITO, IZO, ZnO or the like is usable.

In this manner, the semiconductor device 100 is obtained.

In the case where the upper insulating layer 12b is a reducing insulating layer containing hydrogen as described above as an example, there is a possibility that a part of the channel region 12a is decreased in resistance due to diffusion of the hydrogen in a horizontal direction. However, in the semiconductor device 100 according to this embodiment, the width of the gate electrode 13 and the width of the channel region 12a (defined by the width of the light blocking layer 2) may be controlled independently. Therefore, the width of the channel region 12a (namely, the width of the light blocking layer 2) may be set to be slightly larger than the width of the gate electrode 13, so that the portion of the channel region 12a that overlaps the gate electrode 13 is prevented from being decreased in resistance. This suppresses formation of the parasitic capacitance accompanying the gate electrode 13.

By contrast, in the semiconductor device 800 described in Patent Document No. 1, the width of the channel region 811a is defined by the width of the gate electrode 813. Therefore, if hydrogen is diffused in the horizontal direction even slightly, a parasitic capacitance accompanying the gate electrode 813 is formed.

The semiconductor device 100 is preferably usable in, for example, a liquid crystal display apparatus of an FFS (Fringe Field Switching) mode. In the liquid crystal display apparatus of the FFS mode, a fringe electric field is formed by the pixel electrode 4 and the common electrode 5. The liquid crystal display apparatus is produced as follows, for example.

First, a counter substrate is formed. The counter substrate is formed as follows, for example. A light blocking film (e.g., Ti film having a thickness of 200 nm) is formed on a glass substrate and is patterned into a desired shape, so that a black matrix is obtained. Next, RGB color filters are formed in desired regions respectively, so that the counter substrate is obtained. In the case of a liquid crystal display apparatus of a vertical electric field mode, a counter electrode is located on a surface of the color filters that faces the liquid crystal layer.

Next, a photo spacer is located on the semiconductor device (TFT substrate) 100, and then the TFT substrate 100 and the counter substrate are bonded together. Next, a liquid crystal material is injected into a space between these substrates, so that the liquid crystal layer is obtained. Then, when necessary, the substrate is divided into a desired size, so that the liquid crystal display apparatus is obtained.

Other Embodiments

Figure 8:
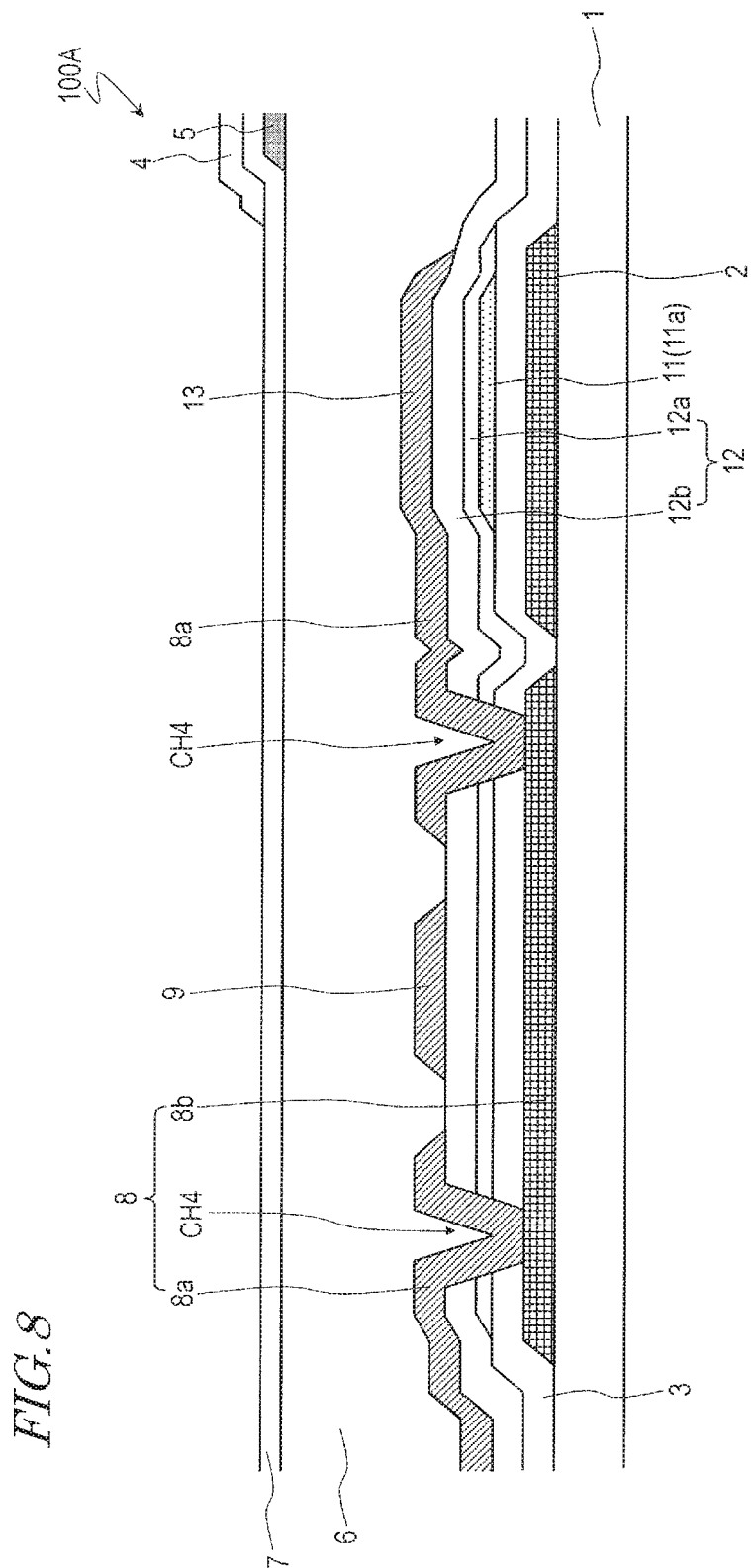
FIG. 8 is a view schematically showing a semiconductor device 100A according to an embodiment of the present invention, and is a cross-sectional view taken along line 8A-8A' in FIG. 9.
Figure 9:
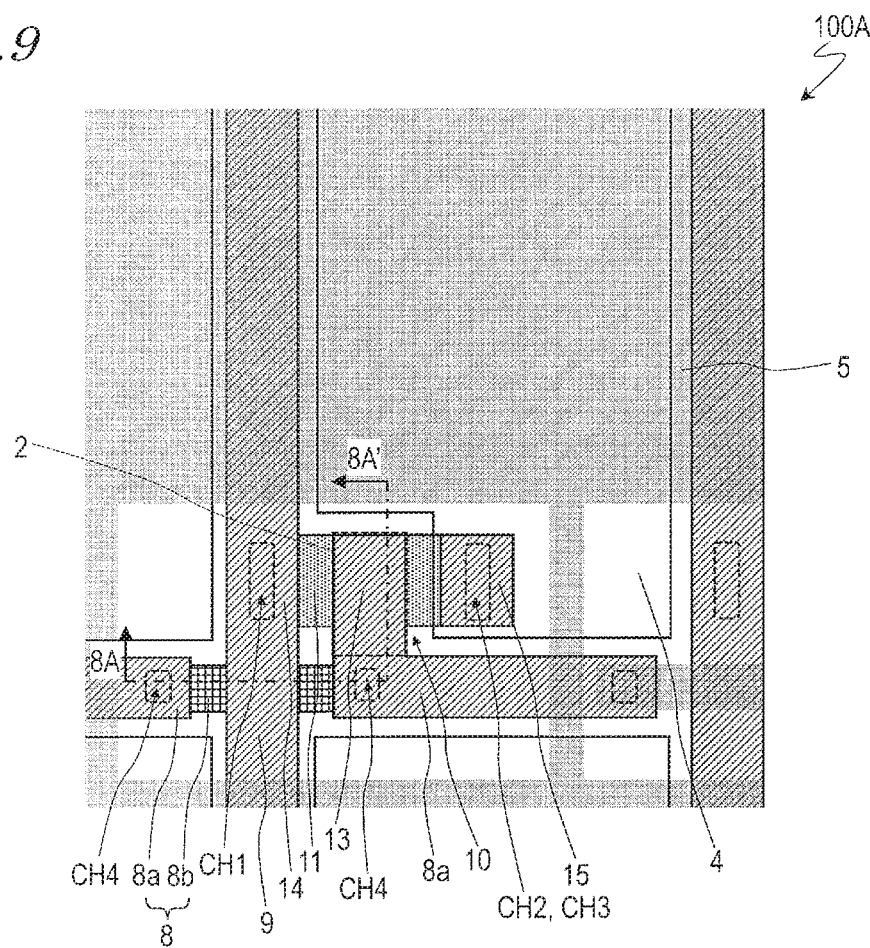
FIG. 9 is a plan view schematically showing the semiconductor device 100A.

FIG. 8 and FIG. 9 show another semiconductor device 100A according to this embodiment. FIG. 8 is a cross-sectional view schematically showing the semiconductor device 100A. FIG. 9 is a plan view schematically showing the semiconductor device 100A. FIG. 8 shows a cross-sectional structure taken along line 8A-8A' in FIG. 9.

In the semiconductor device 100A shown in FIG. 8 and FIG. 9, the light blocking layer 2 is not electrically connected with the scanning line 8, unlike in the semiconductor device 100 shown in FIG. 1 and the like. As shown in FIG. 8, the second portion 8b of the scanning line 8 is not continuous to the light blocking layer 2. Therefore, the light blocking layer 2 of the semiconductor device 100A is in an electrically floating state and thus does not act as a back-gate electrode. In the case where the TFT 10 is not specifically required to have a large on-current, such a structure may be adopted.

Figure 10:
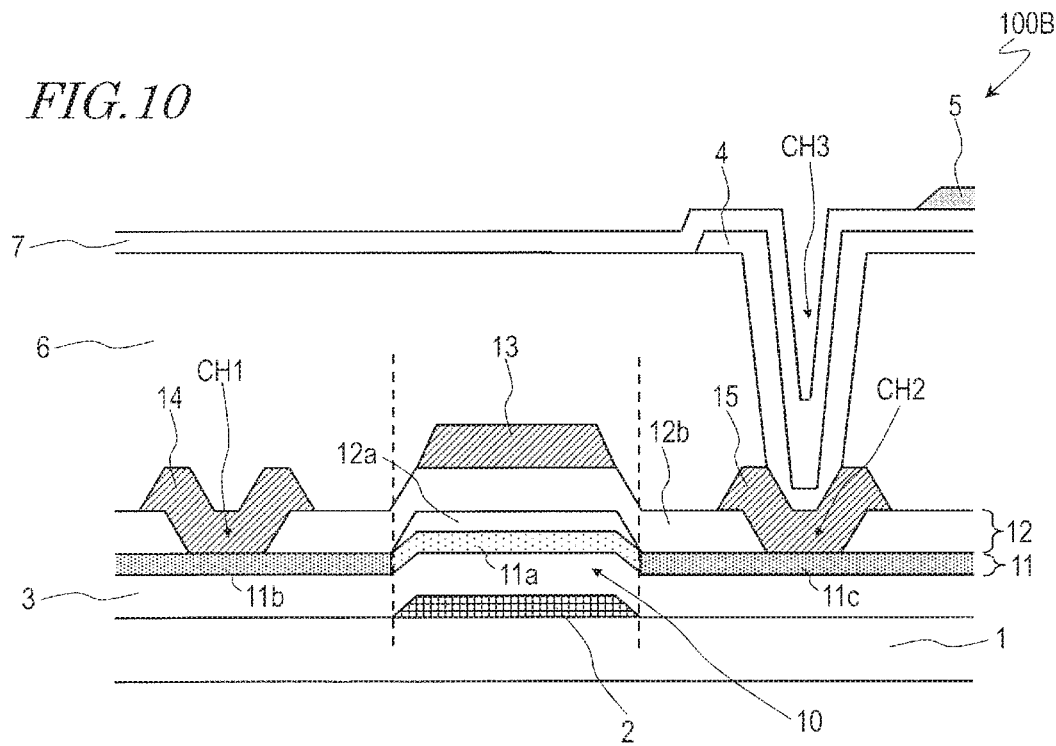
FIG. 10 is a cross-sectional view schematically showing a semiconductor device 100B according to an embodiment of the present invention.

FIG. 10 shows still another semiconductor device 100B according to this embodiment. FIG. 10 is a cross-sectional view schematically showing the semiconductor device 100B.

In the semiconductor device 100B, the pixel electrode 4, the dielectric layer 7 and the common electrode 5 are stacked in this order on the interlayer insulating layer 6, unlike in the semiconductor device 100 shown in FIG. 1 and the like. Namely, in the semiconductor device 100, the common electrode 5 is located below the pixel electrode 4, whereas in the semiconductor device 100B, the common electrode 5 is located above the pixel electrode 4. In the case where the semiconductor device 100B is used in a liquid crystal display apparatus of the FFS mode, at least one slit (opening) is formed in the common electrode 5 in correspondence with each of the pixels.

Embodiment 2

Figure 11:
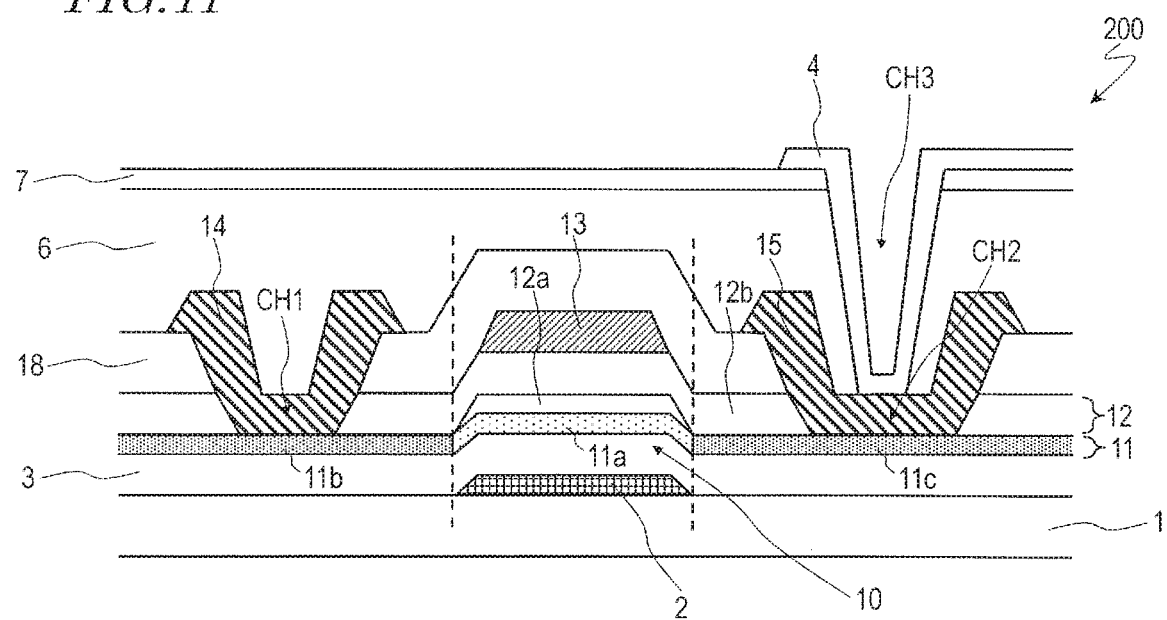
FIG. 11 is a view schematically showing a semiconductor device 200 according to an embodiment of the present invention, and is a cross-sectional view taken along line 11A-11A' in FIG. 13.
Figure 12:
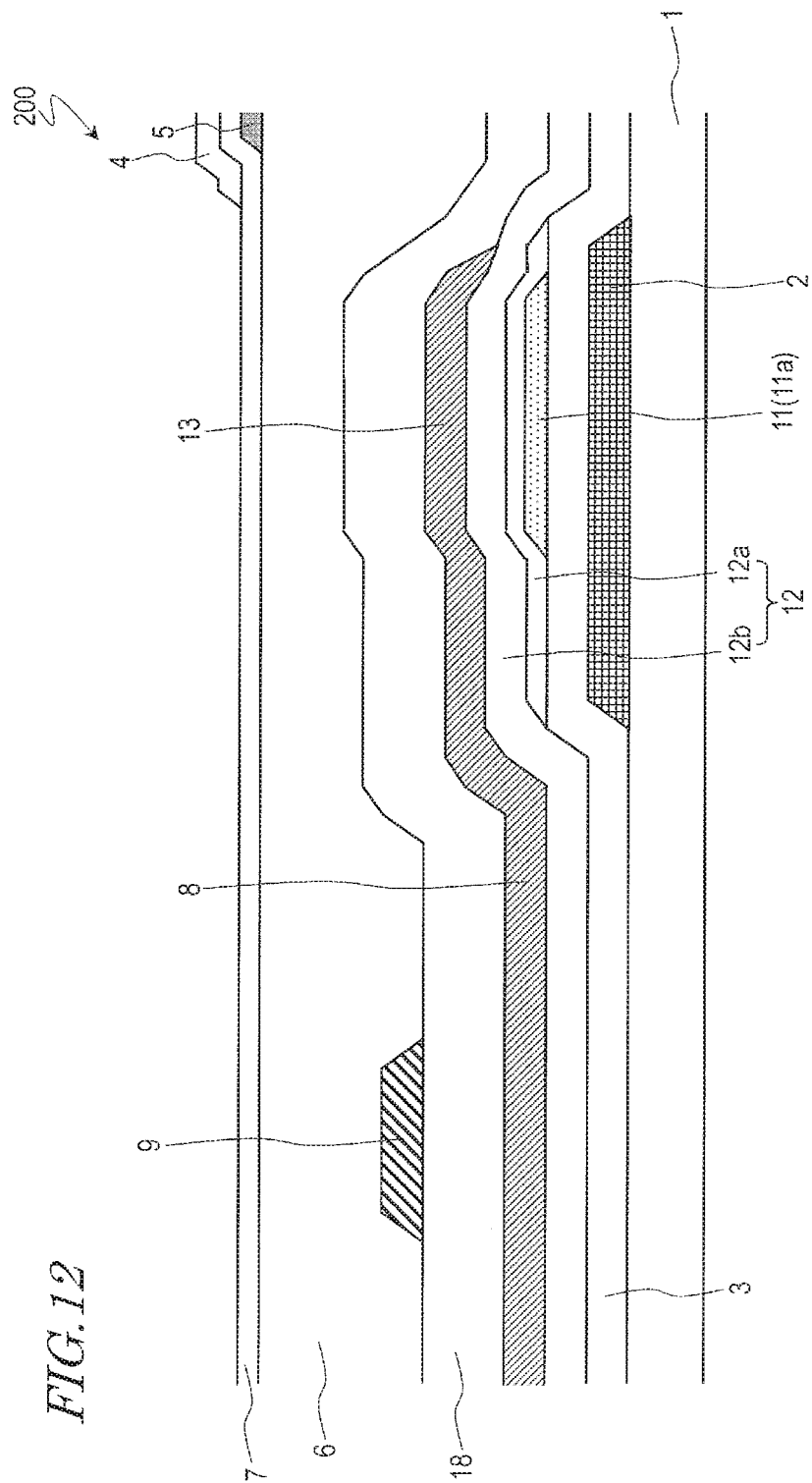
FIG. 12 is a view schematically showing the semiconductor device 200, and is a cross-sectional view taken along line 12A-12A' in FIG. 13.
Figure 13:
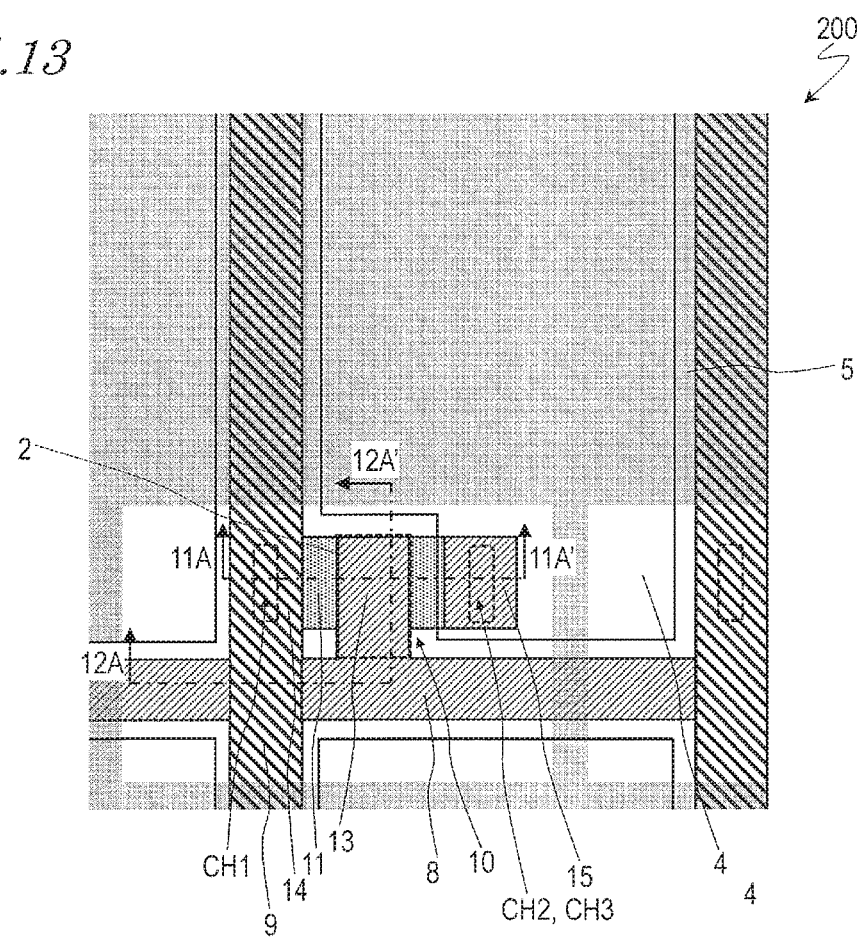
FIG. 13 is a plan view schematically showing the semiconductor device 200.

FIG. 11, FIG. 12 and FIG. 13 each show a semiconductor device (TFT device) 200 according to this embodiment. FIG. 11 and FIG. 12 are each a cross-sectional view schematically showing the semiconductor device 200. FIG. 13 is a plan view schematically showing the semiconductor device 200. FIG. 11 and FIG. 12 respectively show cross-sectional structures taken along lines 11A-11A' and 12A-12A' in FIG. 13. Hereinafter, differences of the semiconductor device 200 from the semiconductor device 100 according to embodiment 1 will be mainly described.

As shown in FIG. 11, FIG. 12 and FIG. 13, in the semiconductor device 200, the gate electrode 13 is formed of a conductive film different from that of the source electrode 14 and the drain electrode 15. Specifically, after the gate electrode 13 is formed, a passivation layer (fourth insulating layer) 18 covering the gate electrode 13 is formed, and then the source electrode 14 and the drain electrode 15 are formed. The passivation layer 18 is formed of, for example, an inorganic insulating material such as silicon oxide, silicon nitride or the like, and has a thickness of, for example, 200 nm or greater and 800 nm or less.

In the gate insulating layer 12 and the passivation layer 18, the contact holes CH1 and CH2 respectively exposing the source contact region 11b and the drain contact region 11c are formed. The source electrode 14 and the drain electrode 15 are respectively connected with the source contact region 11b and the drain contact region 11c in the contact holes CH1 and CH2.

The scanning line 8 is formed of the same conductive film as that of the gate electrode 13, and the signal line 9 is formed of the same conductive film as that of the source electrode 14 and the drain electrode 15. The light blocking layer 2 is not electrically connected with the scanning line 8 and is in an electrically floating state.

The semiconductor device 200 according to this embodiment includes the light blocking layer 2 located between the oxide semiconductor layer 11 and the substrate 1. Therefore, light is prevented from being incident on the channel region 11a of the oxide semiconductor layer 11 from the rear side. With such a structure, photodegradation of the oxide semiconductor layer 11 is suppressed. In the case where the semiconductor device 200 is used in a liquid crystal display apparatus, the luminance of the backlight unit may be made sufficiently high, and thus a sufficient level of visual recognizability is provided when the liquid crystal display apparatus is used outdoors. In the semiconductor device 200 according to this embodiment, the channel region 11a of the oxide semiconductor layer 11 is aligned to the portion of the light blocking layer 2 that overlaps the oxide semiconductor layer 11. Therefore, the parasitic capacitance between the light blocking layer 2 and the source contact region 11b/the drain contact region 11c is decreased.

In addition, in the semiconductor device 200 according to this embodiment, the gate electrode 13 is formed of a conductive film different from that of the source electrode 14 and the drain electrode 15. In the case where such a structure is adopted, the number of production steps is larger than that of the semiconductor device 100 according to embodiment 1. However, it is not needed to form the structure for connection to the second portion 8b in the region where the scanning line 8 and the signal line 9 cross each other. This raises the degree of designing freedom, and thus a high aperture ratio is more easily realized in a high-definition display apparatus. In addition, the resistance value of the scanning line 8 is made lower than in embodiment 1 (because the scanning line 8 does not need to include a portion formed of a transparent conductive material). Therefore, the scanning line 8 is more easily charged. This is advantageous to high speed driving.

Herein, an example in which the light blocking layer 2 is not electrically connected with the scanning line 8 is described. Alternatively, the light blocking layer 2 may be electrically connected with the scanning line 8.

Embodiment 3

Figure 14:
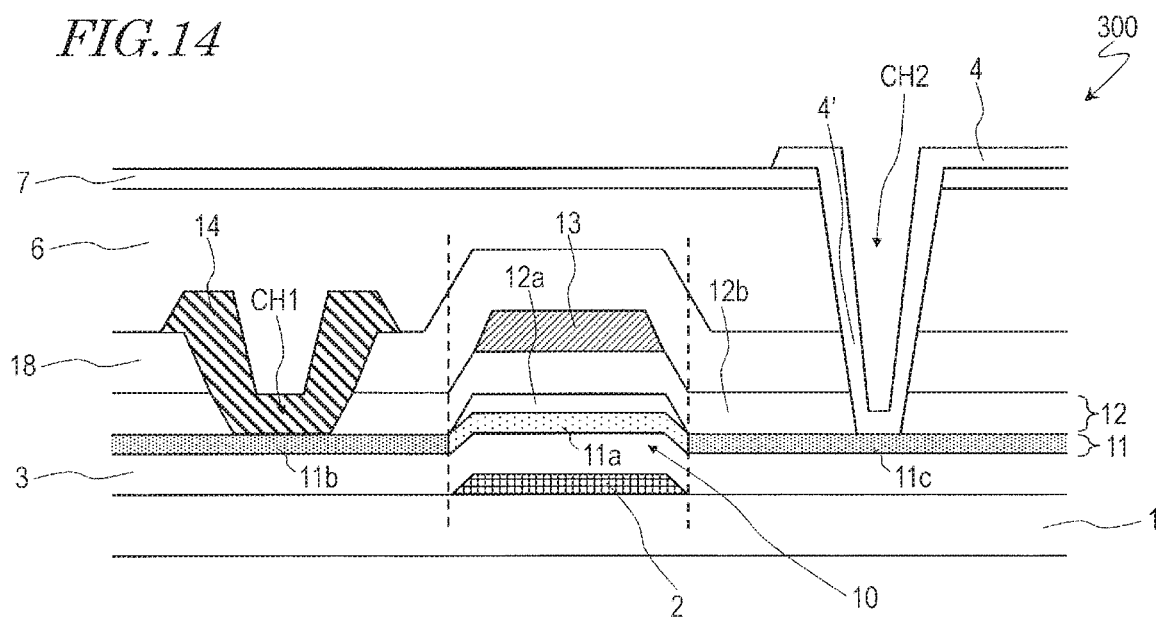
FIG. 14 is a view schematically showing a semiconductor device 300 according to an embodiment of the present invention, and is a cross-sectional view taken along line 14A-14A' in FIG. 15.
Figure 15:
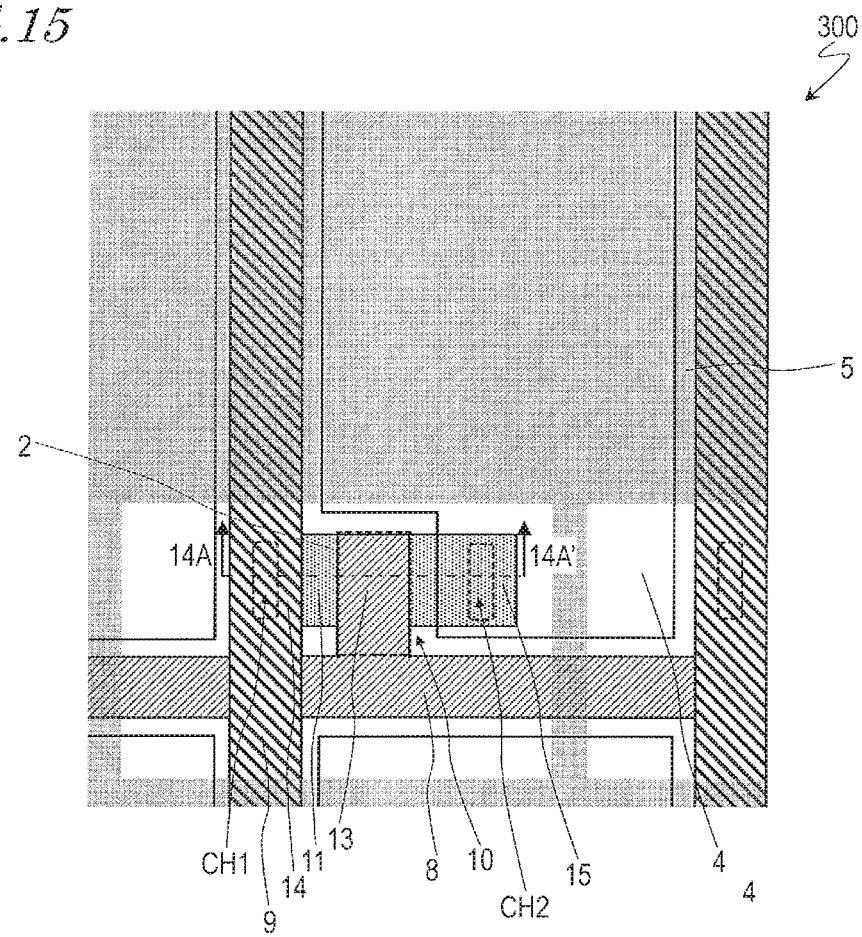
FIG. 15 is a plan view schematically showing the semiconductor device 300.
Figure 16:
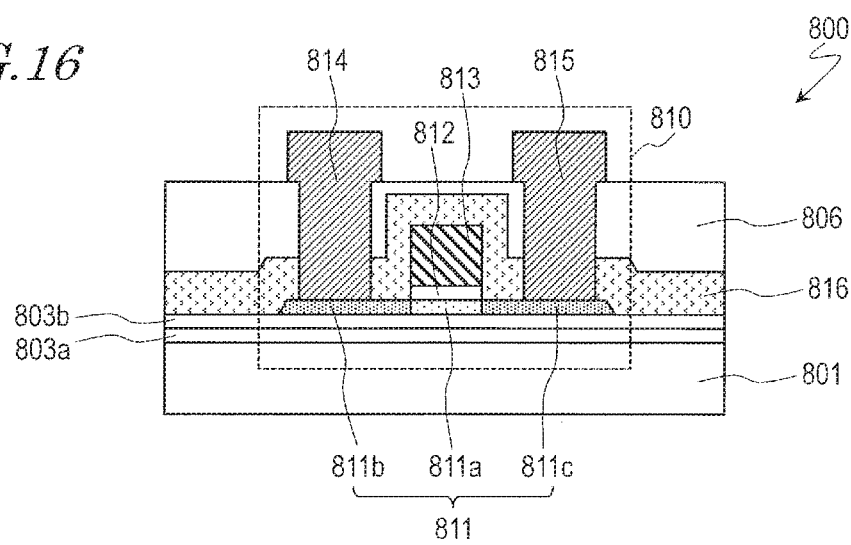
FIG. 16 is a cross-sectional view schematically showing a semiconductor device 800 disclosed in Patent Document No. 1.

FIG. 14 and FIG. 15 each show a semiconductor device (TFT substrate) 300 according to this embodiment. FIG. 14 is a cross-sectional view schematically showing the semiconductor device 300, and FIG. 15 is a plan view schematically showing the semiconductor device 300. FIG. 14 shows a cross-sectional structure taken along line 14A-14A' in FIG. 15. Hereinafter, differences of the semiconductor device 300 from the semiconductor device 100 according to embodiment 2 will be mainly described.

As shown in FIG. 14 and FIG. 15, the TFT 10 of the semiconductor device 300 according to this embodiment does not include a drain electrode formed of the same conductive film as that of the source electrode 14. The semiconductor device 300 includes a transparent connection electrode 4' extending from the pixel electrode 4. In the gate insulating layer 12, the passivation layer 18 and the interlayer insulating layer 6, the contact hole CH2 exposing the drain contact region 11c of the oxide semiconductor layer 11 is formed. The transparent connection electrode 4' is in contact with the drain contact region 11c in the contact hole CH2. Therefore, in this embodiment, the transparent connection electrode 4' acts as the drain electrode.

As described above, in this embodiment, the portion electrically connecting the drain contact region 11c and the pixel electrode 4 to each other (namely, drain contact portion) is formed of transparent members (the oxide semiconductor layer 11 and the transparent connection electrode 4'). Therefore, the drain contact portion is suppressed from being decreased in aperture ratio and light transmittance. Such a structure of this embodiment is advantageous to produce a display apparatus having a high numerical aperture and a high transmittance.

Herein, an example in which the light blocking layer 2 is not electrically connected with the scanning line 8 is described. Alternatively, the light blocking layer 2 may be electrically connected with the scanning line 8.

The semiconductor device 300 according to this embodiment has a structure of the semiconductor device 200 according to embodiment 2 with the drain electrode 15 (drain electrode formed of the same conductive film as that of the source electrode 14) being removed. Alternatively, the drain electrode 15 may be removed from the semiconductor device 100, 100A or 100B according to embodiment 1, and a transparent connection electrode extending from the pixel electrode 4 may be provided and connected with the drain contact region 11c to act as the drain electrode.

INDUSTRIAL APPLICABILITY

According to the embodiments of the present invention, in a semiconductor device including an oxide semiconductor TFT having a top-gate structure, photodegradation of an oxide semiconductor layer caused by light incident on the oxide semiconductor TFT substrate from the rear side, and formation of a parasitic capacitance accompanying a gate electrode, are suppressed. A semiconductor device according to an embodiment of the present invention is preferably usable as an active matrix substrate of a display apparatus including a backlight unit.

REFERENCE SIGNS LIST 1 substrate
2 light blocking layer
3 base coat layer (first insulating layer)
4 pixel electrode
4' transparent connection electrode
5 common electrode
6 interlayer insulating layer (second insulating layer)
7 dielectric layer (third insulating layer)
8 scanning line
8a first portion (upper layer line)
8b second portion (lower layer line)
9 signal line
10 thin film transistor (TFT)
11 oxide semiconductor layer
11a channel region
11b source contact region (first contact region)
11c drain contact region (second contact region)
12 gate insulating layer
12a lower insulating layer
12b upper insulating layer
13 gate electrode
14 source electrode
15 drain electrode
18 passivation layer
100, 100A, 100B, 200, 300 semiconductor device (TFT substrate)
CH1, CH2, CH3, CH4 contact hole

The invention claimed is:

1. A semiconductor device, comprising:
a substrate;
a thin film transistor supported by the substrate;
a scanning line supplying a scanning signal to the thin film transistor; and
a signal line supplying a display signal to the thin film transistor, wherein
the thin film transistor includes:
an oxide semiconductor layer including a channel region, and a first contact region and a second contact region respectively located to two sides of the channel region,
a gate insulating layer provided to cover the oxide semiconductor layer,
a gate electrode provided on the gate insulating layer, the gate electrode overlapping the channel region of the oxide semiconductor layer with the gate insulating layer being located between the gate electrode and the channel region,
a source electrode electrically connected with the first contact region of the oxide semiconductor layer, and
a drain electrode electrically connected with the second contact region of the oxide semiconductor layer,
the semiconductor device further comprises a light blocking layer located between the oxide semiconductor layer and the substrate,
the channel region is aligned to a portion of the light blocking layer that overlaps the oxide semiconductor layer,
the gate electrode and the source electrode are made of a same conductive film,
the semiconductor device further includes:
a pixel electrode electrically connected with the drain electrode, and
a common electrode located above or below the pixel electrode,
the signal line is made of the same conductive film as that of the gate electrode and the source electrode, and
the scanning line includes a first portion made of the same conductive film as that of the signal line and a second portion made of a same transparent conductive film as that of the pixel electrode or the common electrode, the second portion being electrically connected with the first portion.

2. The semiconductor device of claim 1, wherein the drain electrode is made of the same conductive film as that of the gate electrode and the source electrode.

3. The semiconductor device of claim 1, further comprising:
a transparent connection electrode extending from the pixel electrode and in contact with the second contact region of the oxide semiconductor layer, wherein
the transparent connection electrode acts as the drain electrode, and
the pixel electrode is made of a transparent conductive material.

4. The semiconductor device of claim 1, wherein the light blocking layer is made of a conductive material and is electrically connected with the scanning line.

5. The semiconductor device of claim 1, wherein the light blocking layer is not electrically connected with the scanning line and is in an electrically floating state.

6. The semiconductor device of claim 1, wherein
the gate insulating layer includes:
a lower insulating layer covering a portion of the oxide semiconductor layer, and
an upper insulating layer made of a different insulating material from that of the lower insulating layer, the upper insulating layer covering the lower insulating layer and the oxide semiconductor layer, and
the lower insulating layer is aligned to the light blocking layer.

7. The semiconductor device of claim 6, wherein the upper insulating layer is a reducing insulating layer having a property of reducing an oxide semiconductor contained in the oxide semiconductor layer.

8. The semiconductor device of claim 1, wherein the oxide semiconductor layer contains an In—Ga—Zn—O-based oxide.

9. The semiconductor device of claim 8, wherein the In—Ga—Zn—O-based oxide includes a crystalline portion.

10. A semiconductor device, comprising:
a substrate;
a thin film transistor supported by the substrate;
a scanning line supplying a scanning signal to the thin film transistor; and
a signal line supplying a display signal to the thin film transistor, wherein the thin film transistor includes:
an oxide semiconductor layer including a channel region, and a first contact region and a second contact region respectively located to two sides of the channel region,
a gate insulating layer provided to cover the oxide semiconductor layer,
a gate electrode provided on the gate insulating layer, the gate electrode overlapping the channel region of the oxide semiconductor layer with the gate insulating layer being located between the gate electrode and the channel region,
a source electrode electrically connected with the first contact region of the oxide semiconductor layer, and
a drain electrode electrically connected with the second contact region of the oxide semiconductor layer,
the semiconductor device further includes a light blocking layer located between the oxide semiconductor layer and the substrate,
the channel region is aligned to a portion of the light blocking layer that overlaps the oxide semiconductor layer,
the gate insulating layer includes:
a lower insulating layer covering a portion of the oxide semiconductor layer, and
an upper insulating layer made of different insulating material from that of the lower insulating layer, the upper insulating layer covering the lower insulating layer and the oxide semiconductor layer, and
the lower insulating layer is aligned to the light blocking layer.

11. The semiconductor device of claim 10, wherein the gate electrode and the source electrode are made of a same conductive film.

12. The semiconductor device of claim 11, further comprising:
a pixel electrode electrically connected with the drain electrode, and
a common electrode located above or below the pixel electrode, wherein
the signal line is made of a same conductive film as that of the gate electrode and the source electrode, and
the scanning line includes a first portion made of the same conductive film as that of the signal line and a second portion made of a same transparent conductive film as that of the pixel electrode or the common electrode, the second portion being electrically connected with the first portion.

13. The semiconductor device of claim 10, wherein the gate electrode is made of a different conductive film from that of the source electrode and the drain electrode.

14. The semiconductor device of claim 10, wherein the drain electrode is made of a same conductive film as that of the gate electrode and the source electrode.

15. The semiconductor device of claim 10, further comprising:
a pixel electrode made of a transparent conductive material, and
a transparent connection electrode extending from the pixel electrode and in contact with the second contact region of the oxide semiconductor layer,
wherein the transparent connection electrode is the drain electrode.

16. The semiconductor device of claim 10, wherein the light blocking layer is made of a conductive material and is electrically connected with the scanning line.

17. The semiconductor device of claim 10, wherein the light blocking layer is not electrically connected with the scanning line and is in an electrically floating state.

18. The semiconductor device of claim 10, wherein the upper insulating layer is a reducing insulating layer having a property of reducing an oxide semiconductor contained in the oxide semiconductor layer.

19. The semiconductor device of claim 10, wherein the oxide semiconductor layer contains an In—Ga—Zn—O-based oxide.

20. The semiconductor device of claim 19, wherein the In—Ga—Zn—O-based oxide includes a crystalline portion.

21. A method for producing a semiconductor device including a thin film transistor, the thin film transistor including:
an oxide semiconductor layer including a channel region, and a first contact region and a second contact region respectively located to two sides of the channel region,
a gate insulating layer provided to cover the oxide semiconductor layer,
a gate electrode provided on the gate insulating layer, the gate electrode overlapping the channel region of the oxide semiconductor layer with the gate insulating layer being located between the gate electrode and the channel region,
a source electrode electrically connected with the first contact region of the oxide semiconductor layer, and
a drain electrode electrically connected with the second contact region of the oxide semiconductor layer,
the method comprising:
step (A) of forming a light blocking layer on a substrate;
step (B) of forming a first insulating layer covering the light blocking layer;
step (C) of forming the oxide semiconductor layer, partially overlapping the light blocking layer, on the first insulating layer;
step (D) of forming the gate insulating layer covering the oxide semiconductor layer; and
step (E) of forming the gate electrode, overlapping the channel region of the oxide semiconductor layer, on the gate insulating layer, wherein
the channel region of the oxide semiconductor layer is formed in a self-aligned manner to a portion of the light blocking layer that overlaps the oxide semiconductor layer,
the step (D) includes:
step (D-1) of forming a lower insulating layer covering a portion of the oxide semiconductor layer, and
step (D-2) of forming an upper insulating layer, covering the lower insulating layer and the oxide semiconductor layer of a different insulating material from that of the lower insulating layer, and
in the step (D-1), the lower insulating layer is formed in a self-aligned manner to the light blocking layer.

22. The method for producing the semiconductor device of claim 21, wherein
the step (D-1) includes:
step (D-1a) of forming an insulating film on the oxide semiconductor layer, and
step (D-1b) of patterning the insulating film to form the lower insulating layer, and
the step (D-1b) includes a step of performing exposure using the light blocking layer as a mask.

23. The method for producing the semiconductor device of claim 22, wherein the upper insulating layer is a reducing insulating layer having a property of reducing an oxide semiconductor contained in the oxide semiconductor layer, and wherein a portion of the oxide semiconductor layer that is covered with the lower insulating layer becomes the channel region.

* * * * *